(12) United States Patent
Cho

(10) Patent No.: US 12,165,726 B2
(45) Date of Patent: Dec. 10, 2024

(54) ONE-TIME PROGRAMMABLE MEMORY DEVICE AND SEMICONDUCTOR MEMORY DEVICE INCLUDING THE SAME

(71) Applicant: Samsung Electronics Co., Ltd., Suwon-si (KR)

(72) Inventor: Yeongmuk Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 225 days.

(21) Appl. No.: 18/048,462

(22) Filed: Oct. 21, 2022

(65) Prior Publication Data
US 2023/0377672 A1    Nov. 23, 2023

(30) Foreign Application Priority Data
May 19, 2022   (KR) ................... 10-2022-0061298

(51) Int. Cl.
*G11C 29/00*          (2006.01)
*G11C 7/10*           (2006.01)
(Continued)

(52) U.S. Cl.
CPC ............ *G11C 29/42* (2013.01); *G11C 7/1012* (2013.01); *G11C 17/16* (2013.01); *G11C 29/20* (2013.01); *G11C 2029/1202* (2013.01)

(58) Field of Classification Search
CPC .............. G11C 29/832; G11C 13/0033; G11C 13/0035; G11C 13/0064; G11C 16/3404; G11C 16/3454; G11C 16/349; G11C 2029/0409; G11C 29/4401; G11C 29/52; G06F 11/1064; G06F 11/1048; G06F 11/10; G06F 11/1666; G06F 11/1004;
(Continued)

(56) References Cited

U.S. PATENT DOCUMENTS 7,398,348 B2   7/2008  Moore et al.
8,345,501 B2   1/2013  Jeong
(Continued)

FOREIGN PATENT DOCUMENTS

KR   20170054182 A   5/2017
KR   20170117915 A   10/2017
(Continued)

OTHER PUBLICATIONS

Extended European Search Report corresponding to European Patent Application No. 22201910.1 (12 pages) (dated Sep. 11, 2023).

*Primary Examiner* — Thong Q Le
(74) *Attorney, Agent, or Firm* — Myers Bigel, P.A.

(57) ABSTRACT

A one-time programmable (OTP) memory device includes an OTP cell array, an error correction code (ECC) decoder, a double error fuse address register set and a double error fuse counter. The OTP cell array includes OTP cell rows, each of the OTP cell rows includes OTP fuse sets and each of the OTP fuse sets includes OTP memory cells. The ECC decoder performs an ECC decoding operation on first OTP fuse sets and activates a double error detection flag in response to a double bit error being detected in a second subset. The double error fuse address register set stores fuse address information of the second subset and the double error detection flag. The double error fuse counter stores a double error counting signal by counting the double error detection flag based on the latch clock signal.

20 Claims, 23 Drawing Sheets

(51) Int. Cl.
    *G11C 17/16*     (2006.01)
    *G11C 29/20*     (2006.01)
    *G11C 29/42*     (2006.01)
    *G11C 29/12*     (2006.01)

(58) Field of Classification Search
    CPC .... G06F 11/14; G06F 11/141; G06F 11/1415; G06F 12/0246; G06F 12/10; G06F 2201/85; G06F 2201/885; G06F 2212/1032; G06F 2212/7201; G06F 11/00
    See application file for complete search history.

(56) References Cited

U.S. PATENT DOCUMENTS

| | | |
|---|---|---|
| 8,553,486 B2 | 10/2013 | Jeong |
| 8,918,575 B2 | 12/2014 | Markey et al. |
| 9,183,082 B2 | 11/2015 | Kim et al. |
| 9,727,412 B2 | 8/2017 | Son et al. |
| 9,858,142 B2 | 1/2018 | Park |
| 10,020,067 B2 | 7/2018 | Pandey et al. |
| 10,725,841 B1 | 7/2020 | Rahul et al. |
| 11,070,232 B2 | 7/2021 | He et al. |
| 2006/0005107 A1 | 1/2006 | Derner et al. |
| 2013/0044538 A1 | 2/2013 | Oh et al. |
| 2015/0331732 A1 | 11/2015 | Giovannini et al. |
| 2020/0387423 A1 | 12/2020 | Chen et al. |
| 2022/0358016 A1* | 11/2022 | Park ................... G06F 11/1415 |

FOREIGN PATENT DOCUMENTS

| | | |
|---|---|---|
| KR | 102210327 B1 | 2/2021 |
| WO | 2006023196 A2 | 3/2006 |

* cited by examiner

ONE-TIME PROGRAMMABLE MEMORY DEVICE AND SEMICONDUCTOR MEMORY DEVICE INCLUDING THE SAME

CROSS-REFERENCE TO RELATED APPLICATION(S)

This application claims the benefit of priority under 35 USC § 119 to Korean Patent Application No. 10-2022-0061298, filed on May 19, 2022, in the Korean Intellectual Property Office, the disclosure of which is incorporated by reference herein in its entirety.

Example embodiments relate to memories, and more particularly to one-time programmable (OTP) memory devices and semiconductor memory devices including the same.

BACKGROUND

In an OTP memory device, data may be stored using a plurality of OTP cells. For example, each of the OTP cells may have an un-programmed state and a programmed state. Data programmed in an OTP cell can be retained in the absence of power. In this case, the OTP cell may function like a nonvolatile memory. An OTP cell that has been programmed a first time may not be re-programmed a second time. In other words, a programmed OTP cell is irreversible in state. In some examples, an OTP cell may include a fuse or an anti-fuse and may be electrically programmed. OTP memories may be used in the field of electronics for the permanent storage of information in various applications. OTP memories may be used for storing defective addresses.

SUMMARY

Some example embodiments provide an OTP memory device with enhanced reliability and usability.

Some example embodiments provide a semiconductor memory device including an OTP memory device with enhanced reliability and usability.

According to example embodiments, an OTP memory device includes an OTP cell array, an error correction code (ECC) decoder, a double error fuse address register set, a double error fuse counter and a control circuit. The OTP cell array includes a plurality of OTP cell rows, each of the plurality of OTP cell rows includes a plurality of OTP fuse sets and each of the OTP fuse sets includes a plurality of OTP memory cells. The ECC decoder is configured to perform an ECC decoding operation on first OTP fuse sets from among the plurality of OTP fuse sets, each of the first OTP fuse sets configured to store fuse data and parity data, based on the ECC decoding operation, correct a single bit error in response to detection of the single bit error in a first subset from among the first OTP fuse sets, and activate a double error detection flag in response to detection of a double bit error in a second subset from among the first OTP fuse sets. The double error fuse address register set is configured to store fuse address information of the second subset and the double error detection flag based on a latch clock signal. The double error fuse counter is configured to store a double error counting signal by counting the double error detection flag based on the latch clock signal. The control circuit is configured to generate the latch clock signal and control the ECC decoder, the double error fuse address register set, and the double error fuse counter.

According to example embodiments, a semiconductor memory device includes a memory cell array, an OTP memory device, an address comparator and a repair address generator. The memory cell array includes a plurality of memory cell rows and each of the plurality of memory cell rows includes a plurality of memory cells. The OTP memory device is configured to store at least one defective address of at least one defective memory cell row including an uncorrectable error that is determined based on testing the plurality of memory cell rows. The address comparator is configured to output a matching signal by comparing an access address and the at least one defective address stored in the OTP memory device and the access address designates a target memory cell row from among the plurality of memory cell rows. The repair address generator is configured to provide a first row decoder coupled to the memory cell array with a repair address that replaces the at least one defective address, in response to the matching signal indicating that the access address matches the at least one defective address. The OTP memory device includes an OTP cell array, an error correction code (ECC) decoder, a double error fuse address register set, a double error fuse counter, and a control circuit. The OTP cell array includes a plurality of OTP cell rows, each of the plurality of OTP cell rows includes a plurality of OTP fuse sets and each of the OTP fuse sets includes a plurality of OTP memory cells. The ECC decoder is configured to perform an ECC decoding operation on first OTP fuse sets from among the plurality of OTP fuse sets, each of the first OTP fuse sets configured to store fuse data and parity data, based on the ECC decoding operation, correct a single bit error in response to detection of the single bit error in a first subset from among the first OTP fuse sets, and activates a double error detection flag in response to detection of a double bit error in a second subset from among the first OTP fuse sets. The double error fuse address register set is configured to store fuse address information of the second subset and the double error detection flag based on a latch clock signal. The double error fuse counter is configured to store a double error counting signal by counting the double error detection flag based on the latch clock signal. The control circuit is configured to generate the latch clock signal and control the ECC decoder, the double error fuse address register set, and the double error fuse counter.

According to example embodiments, an OTP memory device includes an OTP cell array, a row decoder, a column decoder, a write-sensing circuit coupled to the column decoder, an error correction code (ECC) decoder, a double error fuse address register set, a double error fuse counter, a counter, a selection circuit, a pre-decoder, and a control circuit. The OTP cell array includes a plurality of OTP cell rows, each of the plurality of OTP cell rows includes a plurality of OTP fuse sets and each of the OTP fuse sets includes a plurality of OTP memory cells. The row decoder is coupled to the OTP cell array through a plurality of read word-lines and a plurality of voltage word-lines. The column decoder is coupled to the OTP cell array through a plurality of bit-lines. The ECC decoder is configured to perform an ECC decoding operation on first OTP fuse sets from among the plurality of OTP fuse sets, each of the first OTP fuse sets configured to store fuse data and parity data, based on the ECC decoding operation, correct a single bit error in response to detection of the single bit error in a first subset from among the first OTP fuse sets, and activate a double error detection flag in response to detection of a double bit error in a second subset from among the first OTP fuse sets. The double error fuse address register set is configured to store fuse address information of the second subset and the double error detection flag based on a latch clock signal. The double error fuse counter is configured to store a double error counting signal by counting the double error detection flag based on the latch clock signal. The counter is configured to generate a count signal that is incremented sequentially in response to an activation of a sensing signal. The selection circuit is configured to generate a first selected count signal and a second selected count signal based on the sensing signal and a rupture signal from the control circuit, the first selected count signal being associated with a row address of each of the plurality of OTP fuse sets, and the second selected count signal being associated with a column address of each of the plurality of OTP fuse sets. The pre-decoder is configured to generate a row selection signal, a first column selection signal, and a second column selection based on the first selected count signal and the second selected count signal, provide the row selection signal to the row decoder and provide the first column selection signal and the second column selection to the column decoder. The row selection signal is for selecting one of the plurality of OTP cell rows, the first column selection signal is for selecting one of the plurality of OTP fuse sets as a selected OTP fuse set, the second column selection signal is for selecting one OTP memory cell from among the selected OTP fuse set. The control circuit is configured to generate the latch clock signal and control the ECC decoder, the double error fuse address register set, the double error fuse counter, and the selection circuit.

Accordingly, the OTP memory device may be configured to output a number of defective OTP fuse sets, in each of which a double bit error is detected, to an external device that is outside of the OTP memory device, may be configured to invalidate the fuse data stored in each of the defective OTP fuse sets by programming a dirty bit in each of the defective OTP fuse sets, and may be configured to program the fuse data stored in each of the defective OTP fuse sets in free OTP fuse sets. Accordingly, the OTP memory device may have enhanced reliability and usability.

BRIEF DESCRIPTION OF THE DRAWINGS

Example embodiments will be described below in more detail with reference to the accompanying drawings.

DETAILED DESCRIPTION

Various example embodiments will be described more fully hereinafter with reference to the accompanying drawings, in which example embodiments are shown.

Figure 1:
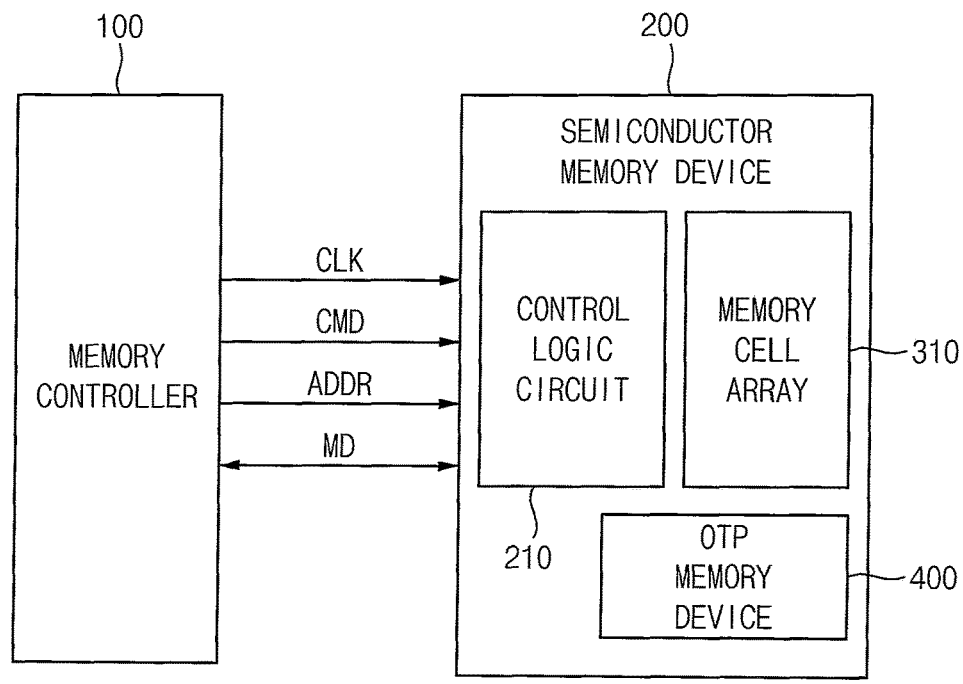
FIG. 1 is a block diagram illustrating an example of a memory system according to example embodiments.

FIG. 1 is a block diagram illustrating an example of a memory system according to example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host.

In addition, the memory controller 100 may issue operation commands to the semiconductor memory device 200 for controlling the semiconductor memory device 200.

In some example embodiments, the semiconductor memory device 200 is a memory device including dynamic memory cells such as a dynamic random access memory (DRAM), double data rate 4 (DDR4) synchronous DRAM (SDRAM), DDR5 SDRAM, a low power DDR4 (LPDDR4) SDRAM, or a LPDDR5 SDRAM.

The memory controller 100 may transmit a clock signal CLK, a command CMD, and an address (signal) ADDR to the semiconductor memory device 200 and may exchange a main data MD with the semiconductor memory device 200.

The semiconductor memory device 200 may include a memory cell array 310 that stores the main data MD, a control logic circuit 210 and a one-time programmable (OTP) memory device 400.

The OTP memory device 400 may store at least one defective address of at least one defective memory cell row including an uncorrectable error that is determined based on testing a plurality of memory cell rows included in the memory cell array 310. In addition, the OTP memory device 400 may include an error correction code (ECC) decoder. The ECC decoder may perform an ECC decoding operation on first OTP fuse sets storing a fuse data and a parity data, respectively, from among a plurality of OTP fuse sets included in the OTP memory device 400, may activate a double error detection flag in response to double bit error being detected in a second portion of OTP fuse sets (i.e., a second subset) from among the first OTP fuse sets, may count the double error detection flag and may output the counted double error detection flag to an external device that is outside of the OTP memory device 400 (i.e., to an external test device) as a counted data. The terms "first," "second," etc., may be used simply to distinguish one element from another.

The control logic circuit 210 may control access to the memory cell array 310 and may control an operation of the OTP memory device 400.

Figure 2:
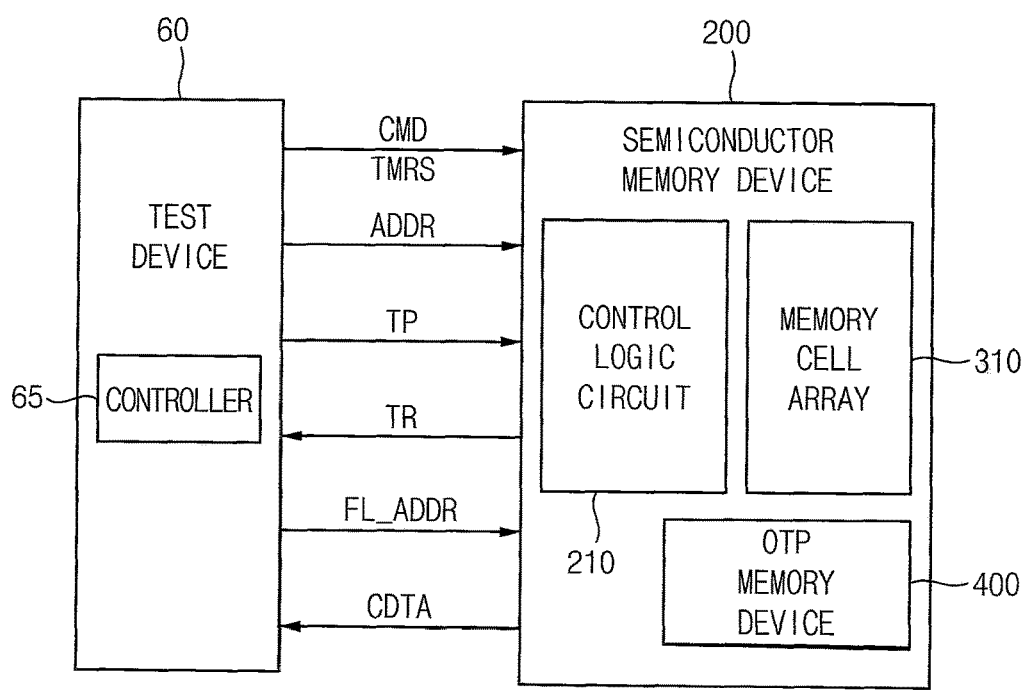
FIG. 2 is a block diagram illustrating another example of a memory system according to example embodiments.

FIG. 2 is a block diagram illustrating another example of a memory system according to example embodiments.

Referring to FIG. 2, a memory system 30 may include a test device 60 and a semiconductor memory device 200.

The semiconductor memory device 200 may include a memory cell array 310 that stores the main data MD, a control logic circuit 210 and an OTP memory device 400.

The test device 60 may perform a testing on the memory cell array 310 in the semiconductor memory device 200. For testing the memory cell array 310, the test device 60 may provide the command CMD, the address ADDR and a test pattern data TP to the semiconductor memory device 200, may receive a test result data TR from the semiconductor memory device 200 and may store, in the OTP memory device 400, at least one defective address FL_ADDR of at least one defective memory cell row including an uncorrectable error that is determined based on testing a plurality of memory cell rows in the memory cell array 310 based on a comparison of the test pattern data TP and the test result data TR.

In addition, the OTP memory device 400 may include an error correction code (ECC) decoder. The ECC decoder may perform an ECC decoding operation on first OTP fuse sets storing a fuse data and a parity data, respectively, from among a plurality of OTP fuse sets included in the OTP memory device 400, may activate a double error detection flag in response to double bit error being detected in a second subset from among the first OTP fuse sets, may count the double error detection flag and may output the counted double error detection flag to the test device 60 as a counted data CDTA. The double bit error may occur in the fuse data, in the parity data or in the fuse data and the parity data.

The test device 60 may include a controller 65 that controls a test sequence on the semiconductor memory device 200. The test device 60 may determine whether to release the semiconductor memory device 200 based on the count data CDTA and may store the at least one defective address FL_ADDR in a portion of free OTP fuse sets that do not store the at least one defective address FL_ADDR from among the plurality of OTP fuse sets.

Therefore, reliability and usability of the OTP memory device 400 and the semiconductor memory device 200 including the OTP memory device 400 may be enhanced.

Figure 3:
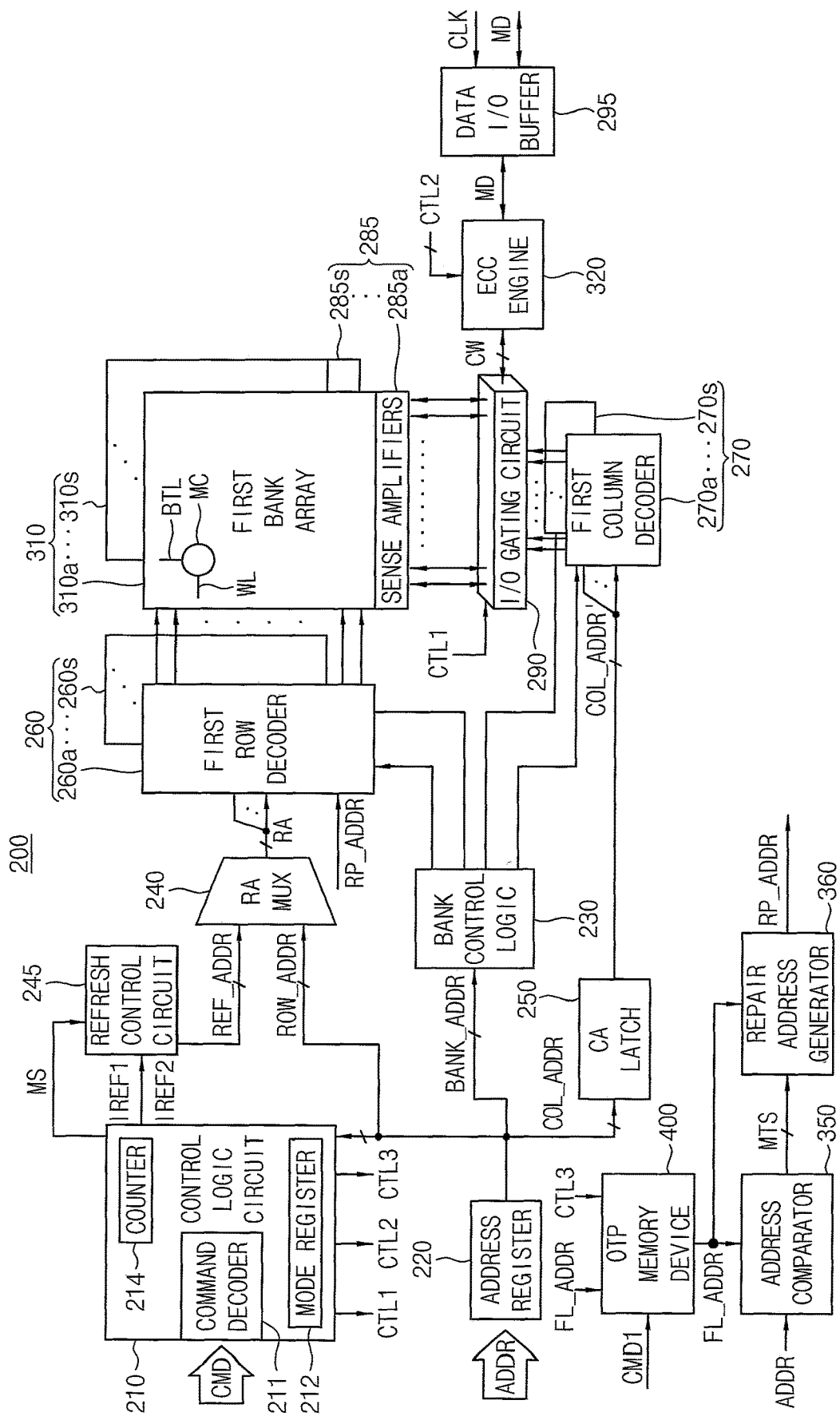
FIG. 3 is a block diagram illustrating an example of the semiconductor memory device in the memory system of FIG. 1 according to example embodiments.

FIG. 3 is a block diagram illustrating an example of the semiconductor memory device in the memory system of FIG. 1 according to example embodiments.

Referring to FIG. 3, the semiconductor memory device 200 may include the control logic circuit 210, an address register 220, a bank control logic 230, a refresh control circuit 245, a row address multiplexer 240, a column address latch 250, a row decoder 260, a column decoder 270, the memory cell array 310, a sense amplifier unit 285, an input/output (I/O) gating circuit 290, an ECC engine 320, a data I/O buffer 295, the OTP memory device 400, an address comparator 350 and a repair address generator 360.

The memory cell array 310 may include a plurality of bank arrays 310a to 310s. The row decoder 260 may include a plurality of bank row decoders 260a to 260s respectively coupled to the plurality of bank arrays 310a to 310s, the column decoder 270 may include a plurality of bank column decoders 270a to 270s respectively coupled to the plurality of bank arrays 310a to 310s, and the sense amplifier unit 285 may include a plurality of sense amplifiers 285a to 285s respectively coupled to the plurality of bank arrays 310a to 310s.

The plurality of bank arrays 310a to 310s, the plurality of bank row decoders 260a to 260s, the plurality of bank column decoders 270a to 270s and plurality of sense amplifiers 285a to 285s may form plurality of banks. Each of the plurality of bank arrays 310a to 310s may include a plurality of volatile memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240 and the address comparator 350, and may provide the received column address COL_ADDR to the column address latch 250.

The bank control logic 230 may generate bank control signals in response to the bank address BANK_ADDR. One of the plurality of bank row decoders 260a to 260s corresponding to the bank address BANK_ADDR may be activated in response to the bank control signals, and one of the plurality of bank column decoders 270a to 270s corresponding to the bank address BANK_ADDR may be activated in response to the bank control signals.

The row address multiplexer 240 may receive the row address ROW_ADDR from the address register 220, and may receive a refresh row address REF_ADDR from the refresh control circuit 245. The row address multiplexer 240 may selectively output the row address ROW_ADDR or the refresh row address REF_ADDR as a row address RA. The row address RA that is output from the row address multiplexer 240 may be applied to the plurality of bank row decoders 260a to 260s.

The refresh control circuit 245 may sequentially output the refresh row address REF_ADDR in response to a first refresh control signal IREF1 or a second refresh control signal IREF2 from the control logic circuit 210.

When the command CMD from the memory controller 100 corresponds to an auto refresh command, the control logic circuit 210 may apply the first refresh control signal IREF1 to the refresh control circuit 245 whenever the control logic circuit 210 receives the auto refresh command.

When the command CMD from the memory controller 100 corresponds to a self-refresh entry command, the control logic circuit 210 may apply the second refresh control signal IREF2 to the refresh control circuit 245 and the second refresh control signal IREF2 is activated from a time point when the control logic circuit 210 receives the self-refresh entry command to a time point when control logic circuit 210 receives a self-refresh exit command. The refresh control circuit 245 may sequentially increase or decrease the refresh row address REF_ADDR in response to receiving the first refresh control signal IREF1 or during or when the second refresh control signal IREF2 is activated.

The activated one of the plurality of bank row decoders 260a to 260s, by the bank control logic 230, may decode the row address RA that is output from the row address multiplexer 240 or a repair address RP_ADDR that is output from the repair address generator 360, and may activate a word-line corresponding to the row address RA or a redundancy word-line corresponding to the repair address RP_ADDR. For example, the activated bank row decoder may apply a word-line driving voltage to the word-line corresponding to the row address RA or the redundancy word-line corresponding to the repair address RP_ADDR.

The column address latch 250 may receive the column address COL_ADDR from the address register 220, and temporarily stores the received column address COL_ADDR. In some embodiments, in a burst mode, the column address latch 250 may generate column addresses COL_ADDR' that increments from the received column address COL_ADDR. The column address latch 250 may apply the temporarily stored or generated column address COL_ADDR' to the plurality of bank column decoders 270a to 270s.

The activated one of the plurality of bank column decoders 270a to 270s may activate a sense amplifier corresponding to the bank address BANK_ADDR and the column address COL_ADDR' through the I/O gating circuit 290.

The I/O gating circuit 290 may include a circuitry for gating input/output data, and may further include input data mask logic, read data latches for storing data that is output from the plurality of bank arrays 310a to 310s, and write drivers for writing data to the plurality of bank arrays 310a to 310s.

Codeword CW read from one bank array of the plurality of bank arrays 310a to 310s may be sensed by a sense amplifier coupled to the one bank array from which the data is to be read, and is stored in the read data latches of the I/O gating circuit 290. The codeword CW stored in the read data latches may be provided to the memory controller 100 via the data I/O buffer 295 after ECC decoding is performed on the codeword CW by the ECC engine 320.

The main data MD to be written in one bank array of the plurality of bank arrays 310a to 310s may be provided to the data I/O buffer 295 from the memory controller 100. The data I/O buffer 295 may provide the main data MD to the ECC engine 320. The ECC engine 320 may perform an ECC encoding operation on the main data MD to generate parity data, and the ECC engine 320 may provide the main data MD and the parity data to the I/O gating circuit 290. The I/O gating circuit 290 may write the main data MD and the parity data in a sub-page of the target page in one bank array through the write drivers.

The data I/O buffer 295 may provide the main data MD from the memory controller 100 to the ECC engine 320 in a write operation of the semiconductor memory device 200, based on the clock signal CLK and may provide the main data MD from the ECC engine 320 to the memory controller 100 in a read operation of the semiconductor memory device 200.

The OTP memory device 400 may store the at least one defective address FL_ADDR of at least one defective memory cell row including an uncorrectable error that is determined based on testing a plurality of memory cell rows in the memory cell array 310. In addition, the OTP memory device 400 may include an error correction code (ECC) decoder. The ECC decoder may perform an ECC decoding operation on first OTP fuse sets storing a fuse data and a parity data, respectively, from among a plurality of OTP fuse sets included in the OTP memory device 400, may activate a double error detection flag in response to double bit error being detected in a second subset from among the first OTP fuse sets, may count the double error detection flag and may output the counted double error detection flag to the test device 60 as the counted data CDTA.

In addition, the OTP memory device 400 may provide the address comparator 350 and the repair address generator 360 with the defective addresses FL_ADDR that are stored in OTP fuse sets in which a single bit error is detected or no error is detected. The single bit error may be detected in the fuse data or the parity data.

The address comparator 350 may compare the row address ROW_ADDR with the defective addresses FL_ADDR that are stored in the OTP memory device 400, may generate a matching signal MTS based on a result of the comparison and may provide the matching signal MTS to the repair address generator 360. The matching signal MTS may include a plurality of bits and may indicate one of the defective addresses FL_ADDR, which matches with the row address ROW_ADDR.

The repair address generator 360, based on the matching signal MTS, may output the repair address RP_ADDR that replaces the defective address designated by the matching signal MTS to the row decoder 260.

The control logic circuit 210 may control operations of the semiconductor memory device 200. For example, the control logic circuit 210 may generate control signals for the semiconductor memory device 200 in order to perform a write operation or a read operation. The control logic circuit 210 may include a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc.

The control logic circuit 210 may generate a first control signal CTL1 to control the I/O gating circuit 290, a second control signal CTL2 to control the ECC engine 320, and a third control signal CTL3 to control the OTP memory device 400. In addition, the control logic circuit 210 may provide the refresh control circuit 245 with a mode signal MS associated with a refresh period. The control logic circuit 210 may generate the mode signal MS based on a temperature signal (not shown) representing an operating temperature of the semiconductor memory device 200.

Figure 4:
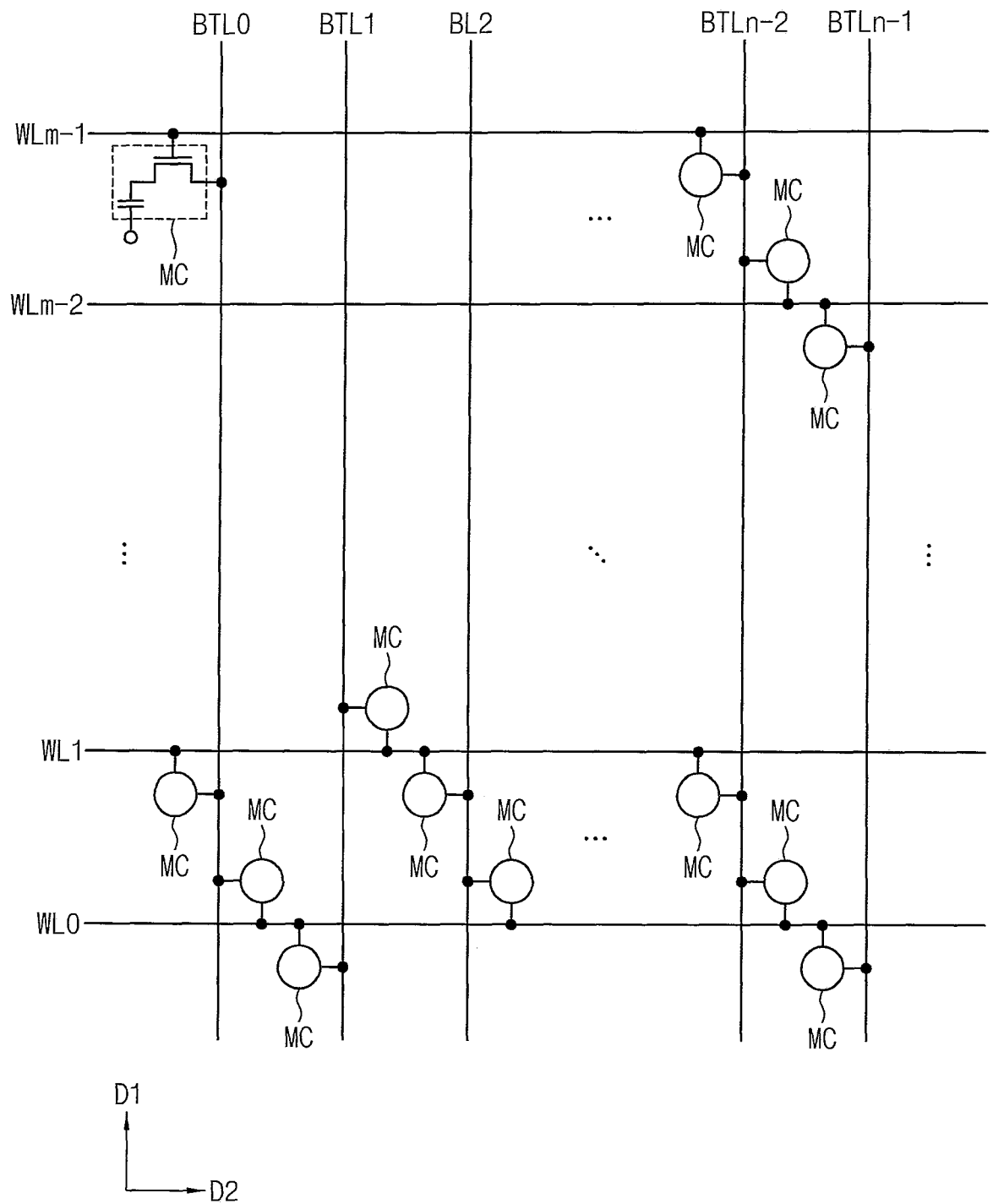
FIG. 4 illustrates an example of the first bank array in the semiconductor memory device of FIG. 3 according to example embodiments.

FIG. 4 illustrates an example of the first bank array in the semiconductor memory device of FIG. 3 according to example embodiments.

Referring to FIG. 4, the first bank array 310a may include a plurality of word-lines WL0 to WLm (m is a natural number greater than two), a plurality of bit-lines BTL0 to BTLn (n is a natural number greater than two), and a plurality of volatile memory cells MCs disposed at intersections between the word-lines WL0 to WLm and the bit-lines BTL0 to BTLn. Each of the memory cells MCs may include a cell transistor coupled to each of the word-lines WL0 to WLm and each of the bit-lines BTL0 to BTLn and a cell capacitor coupled to the cell transistor. Each of the memory cells MCs may have a DRAM cell structure. The bit-lines BTL0 to BTLn extend in a first direction D1 and the word-lines WL0 to WLm in a second direction D2.

Figure 5:
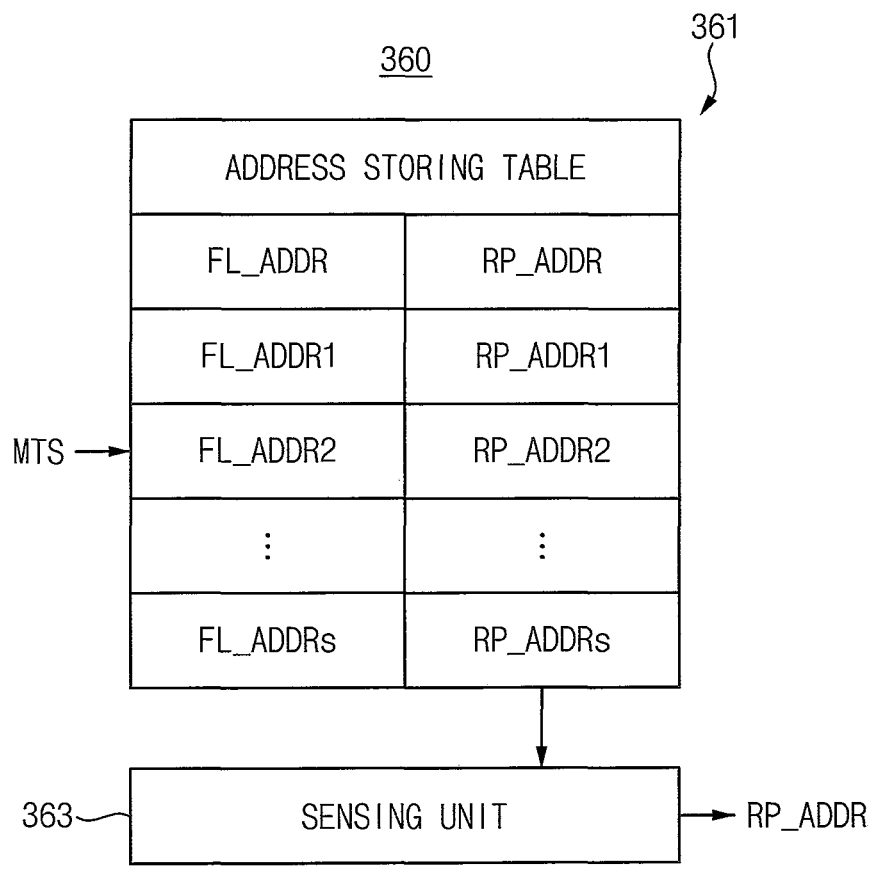
FIG. 5 is a block diagram illustrating an example of the repair address generator in the semiconductor memory device of FIG. 3 according to example embodiments.

FIG. 5 is a block diagram illustrating an example of the repair address generator in the semiconductor memory device of FIG. 3 according to example embodiments.

Referring to FIG. 5, the repair address generator 360 may include an address storing table 361 and a sensing unit 363.

The address storing table 361 may store defective addresses FL_ADDR1, FL_ADDR2, . . . , FL_ADDRs (s is a natural number greater than two) and repair addresses RP_ADDR1, RP_ADDR2, . . . , RP_ADDRs. The defective addresses FL_ADDR1, FL_ADDR2, . . . , FL_ADDRs may be obtained through testing the memory cell array 310. Each of the repair addresses RP_ADDR1, RP_ADDR2, . . . , RP_ADDRs may correspond to respective one of the defective addresses FL_ADDR1, FL_ADDR2, . . . , FL_ADDRs and may replace respective one of the defective addresses FL_ADDR1, FL_ADDR2, . . . , FL_ADDRs.

When one of the defective addresses FL_ADDR1, FL_ADDR2, . . . , FL_ADDRs is selected ion response to the matching signal MTS, the sensing unit 363 may provide the row decoder 260 with the repair address corresponding to the selected defective address from among the defective addresses FL_ADDR1, FL_ADDR2, . . . , FL_ADDRs as the repair address RP_ADDR.

Figure 6:
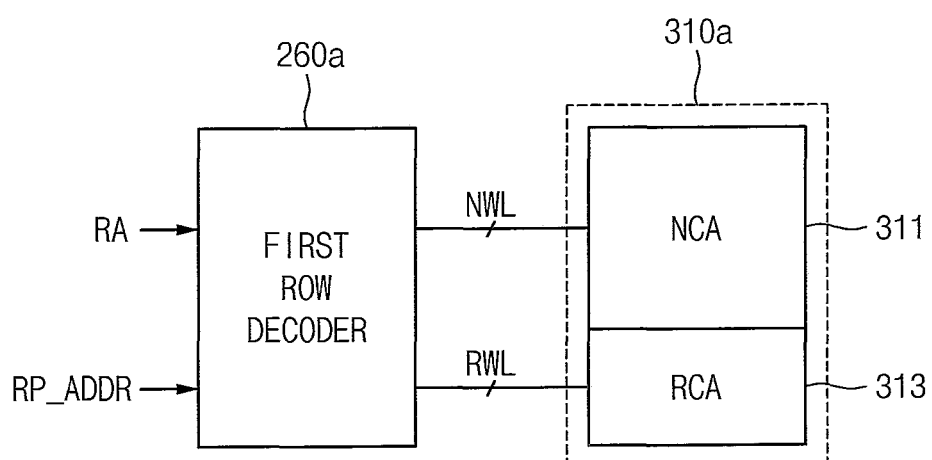
FIG. 6 illustrates the first row decoder and the first bank array in the semiconductor memory device of FIG. 3.

FIG. 6 illustrates the first row decoder and the first bank array in the semiconductor memory device of FIG. 3.

Referring to FIG. 6, the first bank array 310a may include a normal cell array NCA 311 and a redundancy cell array RCA 313.

The normal cell array 311 may include a plurality of normal cells to store data. The normal cells in the normal cell array 311 may be coupled to the first row decoder 260a through normal word-lines NWL. The redundancy cell array 313 may include a plurality of redundancy cells for repairing defective cells in the normal cell array 311 The redundancy cells may have the same constitution and operation principle as the normal cells. The redundancy cells in the redundancy cell array 311 may be coupled to the first row decoder 260a through redundancy word-lines RWL.

In FIG. 6, the first row decoder 260a and the first bank array 310a are illustrated which replace a normal word-line with a redundancy word-line to replace defective cells of the normal cell array 311. However, in some embodiments, the semiconductor memory device 200 (in FIG. 3) is not limited to this configuration. For example, to replace defective cells, the semiconductor memory device 200 may be configured to replace a column line of the normal cell array 311 with a column line of the redundancy cell array 313.

The first row decoder 260a may decode a row address RA to select a part of word-lines of the first bank array 310a. The first row decoder 260a may select a part of the normal word-lines NWL and the redundancy word-lines RWL using the decoded row address RA and the repair address RP_ADDR provided from the repair address generator 360.

Figure 7:
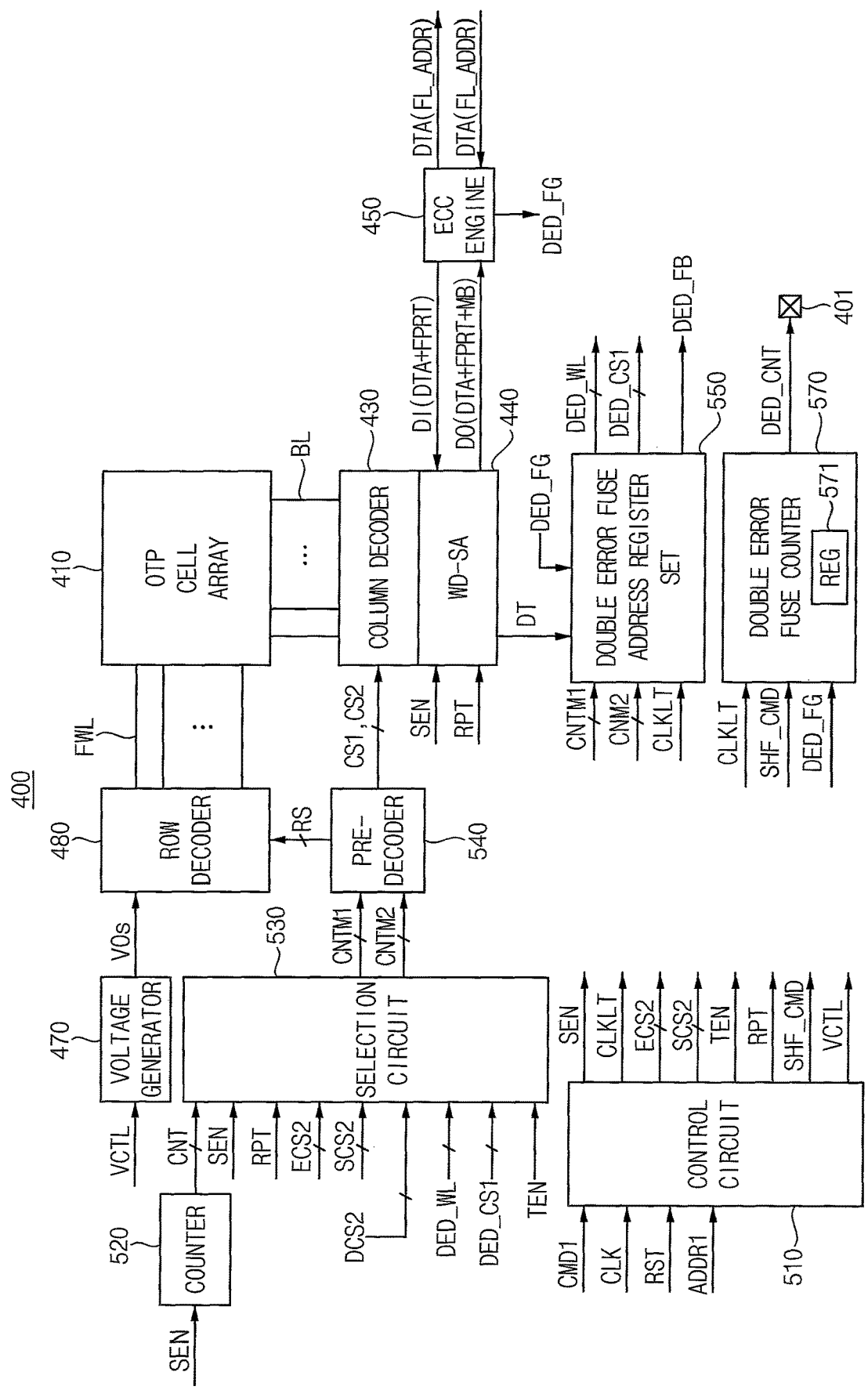
FIG. 7 is a block diagram illustrating an example of the OTP memory device in the semiconductor memory device of FIG. 3 according to example embodiments.

FIG. 7 is a block diagram illustrating an example of the OTP memory device in the semiconductor memory device of FIG. 3 according to example embodiments.

Referring to FIG. 7, the OTP memory device 400 may include an OTP cell array 410, a column decoder 430, a write-sensing circuit WD-SA 440, an ECC engine 450, a voltage generator 470, a row decoder 480, a control circuit 510, a counter 520, a selection circuit 530, a pre-decoder 540, a double error fuse address register set 550 and a double error fuse counter 570.

The OTP cell array 410 may include a plurality of OTP memory cells coupled to a plurality of bit-lines BL and a plurality of word-line FWL. The plurality of word-lines FWL may include a plurality of read word-lines WLR and a plurality of voltage word-lines WLP as will be described with reference to FIG. 9.

The control circuit 510 may control a write operation and a read operation of the OTP memory device 400 based on a command CMD1 and an address ADDR1 received from an external device that is outside of the OTP memory device 400. In addition, the control circuit 510 may control operations of the OTP memory device 400 based on a clock signal CLK and a reset signal RST received from an external device that is outside of the OTP memory device 400.

The control circuit 510 may generate a sensing signal SEN, a latch clock signal CLKLT, an external column selection signal ECS2, a sensing column selection signal SCS2, a test signal TEN, a rupture signal RPT, a shift command SHF_CMD and a voltage control signal VCTL for controlling the write-sensing circuit WD-SA 440, the ECC engine 450, the voltage generator 470, the counter 520, the selection circuit 530, the double error fuse address register set 550 and the double error fuse counter 570 and may provide the sensing signal SEN, the latch clock signal CLKLT, the external column selection signal ECS2, the sensing column selection signal SCS2, the test signal TEN, the rupture signal RPT, the shift command SHF_CMD and the voltage control signal VCTL to associated components.

The column decoder 430 may be coupled to the OTP cell array 410 through the bit-lines BL. The column decoder 430 may select some of the bit-lines BL based on a first column selection signal CS1 and a second column selection signal CS2 which are provided from the pre-decoder 540.

The write-sensing circuit 440 may be connected to the column decoder 430, may write input data DI provided from the ECC engine 450 in the OTP cell array 410 through the column decoder 430 and may read output data DO from the OTP cell array 110 through the column decoder 430 to provide the output data DO to the ECC engine 450.

The write-sensing circuit 440 may include a write driver and a sense amplifier. The sense amplifier may perform a read operation for sensing the data stored in the OTP memory cells and providing the read data to the outside (e.g., to an external device) as the output data DO. The write driver may perform a write operation for storing the write data in the OTP memory cells. The write driver and the sense amplifier may be formed in a same circuit or device or may be formed in separate circuits or devices.

The row decoder 480 may be connected to the OTP cell array 410 through the word-lines FWL. The row decoder 480 may determine one of the word-lines FWL as a selected word-line and may determine the rest of the word-lines FWL except the selected word-line as unselected word-lines based on a row selection signal RS provided from the pre-decoder 540.

The voltage generator 470 may generate operating voltages VOs based on the voltage control signal VCTL provided from the control circuit 510 and may provide the operating voltages VOs to the word-lines FWL through the row decoder 480.

The count 520 may generate a count signal CNT that increments sequentially in response to an activation of the sensing signal SEN and may provide the count signal CNT to the selection circuit 530.

The selection circuit 530 may receive the sensing signal SEN, the rupture signal RPT, the external column selection signal ECS2, the sensing column selection signal SCS2, and the test signal TEN from the control circuit 510, may receive the count signal CNT form the counter 520, may receive a double error flag bit DED_FB from the double error fuse address register set 550 and may receive a default column selection signal DCS2 including default bits. The selection circuit 530 may generate a first selected count signal CNTM1 and a second selected count signal CNTM2 based on the count signal CNT, the sensing signal SEN and the rupture signal RPT and may provide the first selected count signal CNTM1 and the second selected count signal CNTM2 to the pre-decoder 540. The first selected count signal CNTM1 may be associated with a row address of each of a plurality of OTP fuse sets in the OTP cell array 410 and the second selected count signal CNTM2 may be associated with a column address of each of the plurality of OTP fuse sets.

The pre-decoder 540 may generate the row selection signal RS for selection one of a plurality of OTP cell rows in the OTP cell array 410, the first column selection signal CS1 for selecting one of OTP fuse sets in the selected OTP cell row and the second column selection signal CS2 for selecting one of OTP memory cells in the selected OTP fuse set, based on the first selected count signal CNTM1 and the second selected count signal CNTM2, may provide the row selecting signal RS to the row decoder 480 and may provide the first column selection signal CS1 and the second column selection signal CS2 to the column decoder 430.

The column decoder 430 may select one of OTP fuse sets in the selected OTP cell row based on the first column selection signal CS1 and may select one of OTP memory cells in the selected OTP fuse set based on the second column selection signal CS2.

The ECC engine 450, in a write operation in response to an activation of the rupture signal RPT, may receive the defective address FL_ADDR designating a defective memory cell row in the memory cell array 310 in FIG. 3, as a fuse data DTA, may generate a parity data FPRT by performing an ECC encoding (operation) on the fuse data DTA and may provide the write-sensing circuit 440 with the input data DI including the fuse data DTA and the parity data FPRT.

The write-sensing circuit 440 may program the input data DI including the fuse data DTA and the parity data FPRT in a target OTP fuse set from among the plurality of OTP fuse sets in the OTP cell array 410 through the column decoder 430, in response to the activation of the rupture signal RPT.

The write-sensing circuit 440, in a read operation in response to an activation of the sensing signal SEN, may read a master bit MB, a dirty bit DT, the fuse data DTA and the parity data FPRT stored in the plurality of OTP fuse sets, may provide the dirty bit DT to the double error fuse address register set 550 and may provide the ECC engine 450 with the master bit MB, the fuse data DTA and the parity data FPRT as the output data DO.

The ECC engine 450, in a read operation in response to an activation of the sensing signal SEN, may receive the output data DO including the master bit MB, the fuse data DTA and the parity data FPRT from the write-sensing circuit 440, and may perform an ECC decoding (operation) on the fuse data DTA and the parity data FPRT in response to the master bit MB having a first logic level (e. g., a logic high level). The ECC engine 450, based on a result of the ECC decoding, may correct a single bit error in response to the single bit error being detected in the fuse data DTA or the parity data FPRT, may output the data DTA including the defective address FL_ADDR, and activate a double error detection flag DED_FG in response to double bit error being detected in the fuse data DTA and the parity data FPRT while outputting the fuse data DTA without correcting the double bit error.

The ECC engine 450 may perform an ECC decoding operation on first OTP fuse sets from among the plurality of OTP fuse sets, each of which storing the fuse data DTA and the parity data FPRT, based on a result of the ECC decoding, may correct the single bit error in response to the single bit error being detected in a first portion of OTP fuse sets (i.e., a first subset) from among the first OTP fuse sets, may activate the double error detection flag DED_FG in response to double bit error being detected in a second portion of OTP fuse sets (i.e., a second subset) from among the first OTP fuse sets, and may provide the double error detection flag DED_FG to the double error fuse address register set 550 and the double error fuse counter 570.

In some embodiments, the ECC engine 450 may perform an ECC decoding operation on the plurality of OTP fuse sets in the OTP cell array 410 without regard to the master bit MB, may activate the double error detection flag DED_FG in response to double bit error being detected in a portion of the plurality of OTP fuse sets and may provide the double error detection flag DED_FG to the double error fuse address register set 550 and the double error fuse counter 570.

The double error fuse address register set 550, in response to a low level of the dirty bit DT, an activation of the double error detection flag DED_FG, a rising transition of the latch clock signal CLKLT, may store the first selected count signal CNTM1 and the second selected count signal CNTM2 from the selection circuit 530 in an inside of the double error fuse address register set 550 as a defective row address and a defective column address of a defective OTP fuse set in which the double bit error is detected and may store the double error detection flag DED_FG, in the inside of the double error fuse address register set 550.

The double error fuse address register set 550, in response to an activation of the rupture signal RPT and an activation of the test signal TEN, may provide the selection circuit 530 with the first selected count signal CNTM1 and the second selected count signal CNTM2 as a defective row address DED_WL and a defective column address DED_CS1 of a defective OTP fuse set, respectively, and may provide the double error detection flag DED_FG to the selection circuit 530 as the double error flag bit DED_FB.

The selection circuit 530, in response to an activation of the rupture signal RPT and an activation of the test signal TEN, may provide the pre-decoder 540 with the defective row address DED_WL as the first selected count signal CNTM1 and may provide the pre-decoder 540 with the defective column address DED_CS1 and the double error flag bit DED_FB as the second selected count signal CNTM2.

The double error fuse counter 570 may store double error counted value DED_CNT in a register 571 by counting the activated the double error detection flag DED_FG in response to a rising transition of the latch clock signal CLKLT and may output the double error counted value DED_CNT to an outside (i.e., the test device 60 in FIG. 2) through an I/O pin 401 in response to the shift command SHF_CMD.

Figure 8:
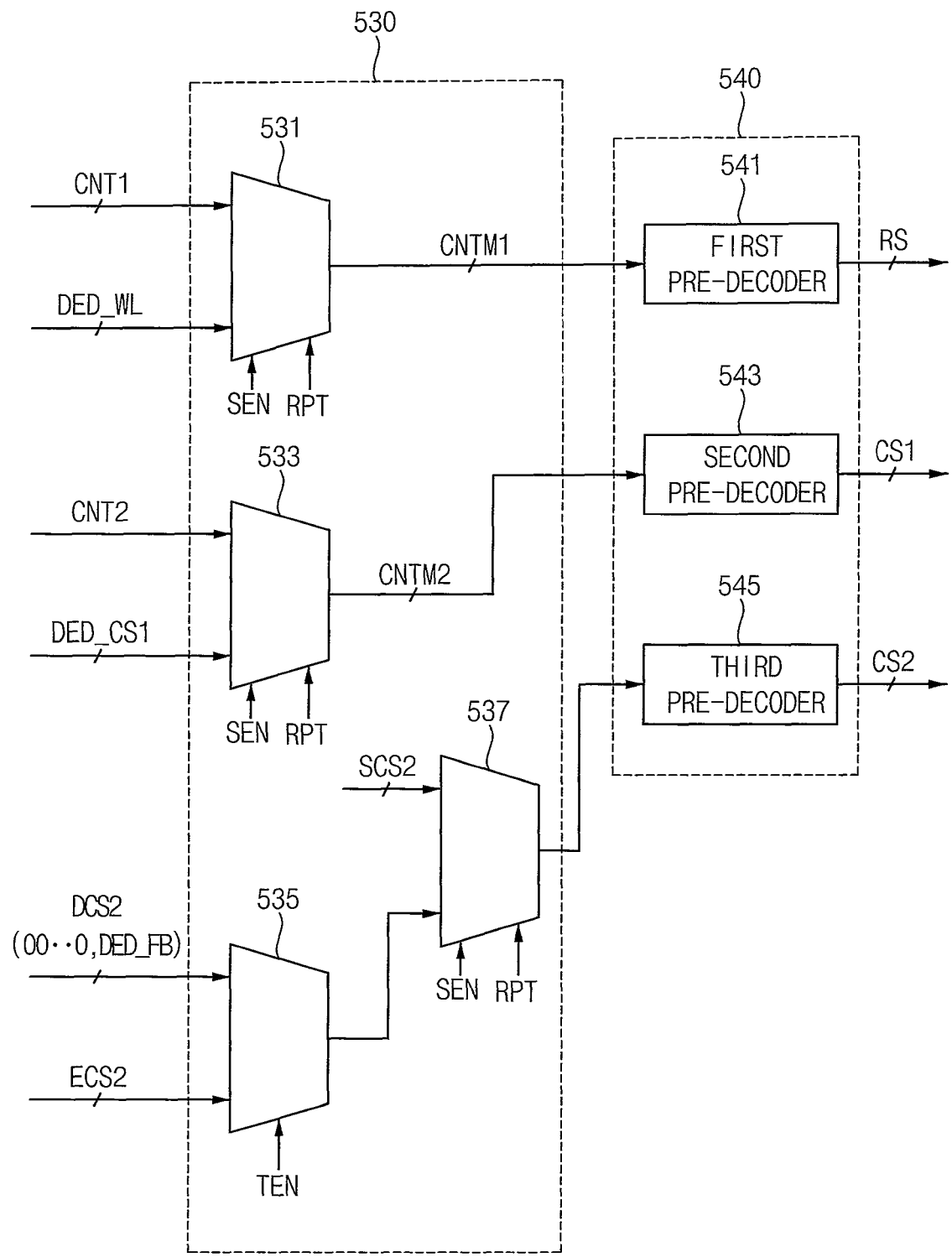
FIG. 8 illustrates the selection circuit and the pre-decoder in the OTP memory device of FIG. 7 according to example embodiments.

FIG. 8 illustrates the selection circuit and the pre-decoder in the OTP memory device of FIG. 7 according to example embodiments.

Referring to FIG. 8, the selection circuit 530 may include a first multiplexer 531, a second multiplexer 533, a third multiplexer 535 and a fourth multiplexer 537. The pre-decoder 540 may include a first pre-decoder 541, a second pre-decoder 543 and the third pre-decoder 545.

The first multiplexer 531 may receive a first count signal CNT1 corresponding to a first portion of bits of the count signal CNT and the defective row address DED_WL, and may output the first selected count signal CNTM1 by selecting one of the first count signal CNT1 and the defective row address DED_WL, based on the sensing signal SEN and the rupture signal RPT. For example, the first multiplexer 531 may output the first count signal CNT1 as the first selected count signal CNTM1 in response to an activation of the sensing signal SEN and may output the defective row address DED_WL as the first selected count signal CNTM1 in response to an activation of the rupture signal RPT.

The second multiplexer 533 may receive a second count signal CNT2 corresponding to a second portion of bits of the count signal CNT and the defective column address DED_CS1, and may output the second selected count signal CNTM2 by selecting one of the second count signal CNT2 and the defective column address DED_CS1, based on the sensing signal SEN and the rupture signal RPT. For example, the second multiplexer 533 may output the second count signal CNT2 as the second selected count signal CNTM2 in response to an activation of the sensing signal SEN and may output the defective column address DED_CS1 as the second selected count signal CNTM2 in response to an activation of the rupture signal RPT.

The third multiplexer 535 may elect one of the default column selection signal DCS2 and the external column selection signal ECS2 based on the test signal TEN. The default column selection signal DCS2 may include bits such as '0, 0, . . . , 0' and the double error detection flag bit DED_FB. For example, the third multiplexer 535 may select the external column selection signal ECS2 in response to a deactivation of the test signal TEN and may select the default column selection signal DCS2 in response to an activation of the test signal TEN. The control circuit 510 may generate the external column selection signal ECS2 based on the address ADDR1 in a write operation and may provide the external column selection signal ECS2 to the selection circuit 530.

The fourth multiplexer 537 may receive the sensing column selection signal SCS2 and an output of the third multiplexer 535 and may select one of the sensing column selection signal SCS2 and the output of the third multiplexer 535, based on the sensing signal SEN and the rupture signal RPT. For example, the fourth multiplexer 537 may select the sensing column selection signal SCS2 in response to an activation of the sensing signal SEN and may select the output of the third multiplexer 535 in response to an acti-vation of the rupture signal RPT. The control circuit 510 may generate the sensing column selection signal SCS2 based on the address ADDR1 in a read operation and may provide the sensing column selection signal SCS2 to the selection circuit 530.

The first pre-decoder 541 may generate the row selection signal RS by decoding the first selected count signal CNTM1 and may provide the row selection signal RS to the row decoder 480. The first pre-decoder 541 may generate the row selection signal RS by decoding the first count signal CNT1 when the sensing signal SEN is activated and may generate the row selection signal RS by decoding the defective row address DED_WL when the rupture signal RPT is activated.

The second pre-decoder 543 may generate the first column selection signal CS1 by decoding the second selected count signal CNTM2 and may provide the first column selection signal CS1 to the column decoder 430. The second pre-decoder 543 may generate the first column selection signal CS1 by decoding the second count signal CNT2 when the sensing signal SEN is activated and may generate the first column selection signal CS1 by decoding the defective column address DED_CS2 when the rupture signal RPT is activated.

The third pre-decoder 545 may generate the second column selection signal CS2 by decoding an output of the fourth multiplexer 537 and may provide the second column selection signal CS2 to the column decoder 430. The third pre-decoder 545 may generate the second column selection signal CS2 by decoding the sensing column selection signal SCS2 when the sensing signal SEN is activated and may generate the second column selection signal CS2 by decoding the default column selection signal DCS2 when the test signal TEN is activated and the rupture signal RPT is activated. Therefore, when the double error detection flag DED_FG is activated, the test signal TEN is activated and the rupture signal RPT is activated, the second column selection signal CS2 may designate an OTP memory cell that stores a dirty bit of the defective OTP fuse set in which the double bit error is detected.

Figure 9:
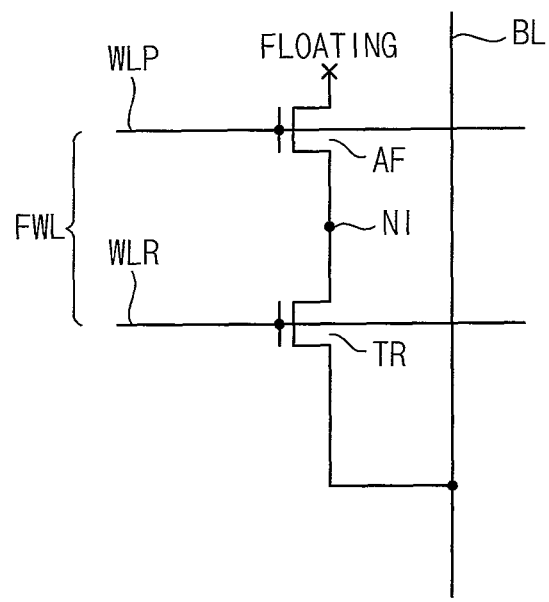
FIG. 9 illustrates an example of an OTP memory cell in the OTP memory device of FIG. 7.

FIG. 9 illustrates an example of an OTP memory cell in the OTP memory device of FIG. 7.

Referring to FIG. 9, an OTP memory cell UCa may include an anti-fuse AF and a read transistor TR.

The anti-fuse AF may be connected between a corresponding voltage word-line WLP and an intermediate node NI. The read transistor TR may be connected between the intermediate node NI and a corresponding bit-line BL and may have a gate coupled to a corresponding read word-line WLR.

The anti-fuse AF may include, for example, a metal-oxide semiconductor (MOS) transistor. In an example embodiment, as illustrated in FIG. 9, a drain electrode of the MOS transistor AF may be floated, a source electrode of the MOS transistor AF may be connected to the intermediate node NI, and a gate electrode of the MOS transistor AF may be connected to the voltage word-line WLP.

The anti-fuse AF is an example element of the OTP memory cell. In an example embodiment, the anti-fuse AF may have electrical features opposite that of a typical fuse, e.g., the anti-fuse AF may have a higher resistance value in an un-programmed state and a lower resistance value in a programmed state.

The anti-fuse AF may include a dielectric material between two conductors. The dielectric material may be broken and programmed by applying a high voltage between the two conductors for a sufficient time. When programmed in this manner, the two conductors may be electrically connected through the broken dielectric material. Thus, the anti-fuse AF may have the lower resistance value. In an anti-fuse type OTP memory, a MOS capacitor may have a thin gate oxide that is used as the anti-fuse AF. A high voltage may be applied between the two electrodes of the MOS capacitor to program the MOS capacitor. An OTP memory cell using a MOS capacitor may have a small cell area and a low program current. Thus, low power and byte-wide programming may be achieved.

A program voltage of a relatively high voltage level may be applied to the voltage word-line WLP in a program mode. A read voltage having a lower voltage level than the program voltage may be applied to the voltage word-line WLP in a read mode. A selection voltage with a voltage level sufficient to turn on the read transistor TR may be applied to the read word-line WLR in the program and read modes.

In the program mode, a program permission voltage may be applied to the bit-lines connected to the OTP memory cells to be programmed and a program inhibition voltage greater than the program permission voltage may be applied to the bit-lines connected to the OTP memory cells that are not to be programmed. For example, the program permission voltage may be set to ground voltage, and/or the program inhibition voltage and the read voltage may be set to a power supply voltage. The voltage levels of the program voltage, the read voltage, the program permission voltage, and/or the program inhibition voltage may be different in other embodiments of the inventive concept, for example, depending on the characteristics and/or configuration of the OTP memory cells.

The programming of the anti-fuse AF may be performed in the program mode. For example, in the program mode, the program voltage may be applied to the voltage word-line WLP, the selection voltage may be applied to the read word-line WLR to turn on the read transistor TR, and the program permission voltage may be applied to the bit-line BL.

Figure 10:
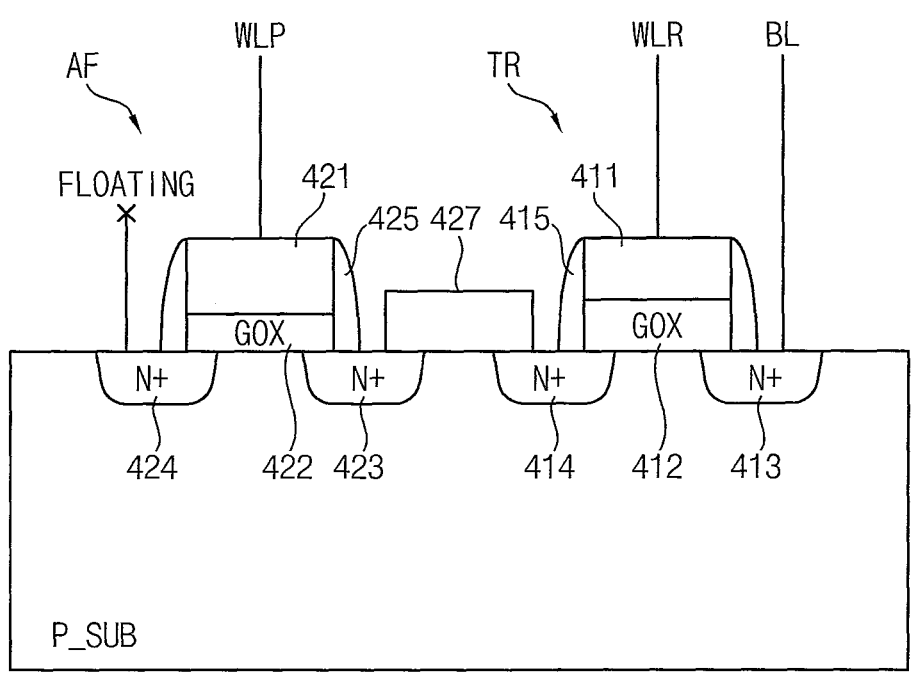
FIG. 10 is a cross-sectional view of the OTP memory cell of FIG. 9.

FIG. 10 is a cross-sectional view of the OTP memory cell of FIG. 9.

Referring to FIG. 10, the OTP memory cell UCa may include an anti-fuse AF and a read transistor TR on a same substrate P_SUB.

The read transistor TR may include a first gate 411 connected to a corresponding read word-line WLR, a first gate insulation layer (GOX) 412 insulating the first gate 411 from the substrate P-SUB, a first source region 413 connected to a corresponding bit-line BL, and a first drain region 414.

The anti-fuse AF may include a second gate 421 connected to a corresponding voltage word-line WLP, a second gate insulation layer 422 insulating the second gate 421 from the substrate P SUB, a second source region 423 connected to the first drain region 414 of the read transistor TR, and a second drain region 424 that is floated.

The second source region 423 of the anti-fuse AF may be electrically connected to the first drain region 414 of the read transistor TR by a conduction path 427. The conduction path 427 may include metal lines in an upper space and an interlayer structure such as vias for connecting the metal lines to the upper surface of the substrate P SUB. For example, the vias on a first side of the conduction path 427 may be connected to the second source region 423 and the vias on a second side of the conduction path 427 may be connected the first drain region 414. In an embodiment, the second source region 423 of the anti-fuse AF and the first drain region 414 of the read transistor TR may be combined. In such a case, the conduction path 427 may be omitted.

For example, the substrate P_SUB may be doped with p-type impurities, and the first and second source regions 413 and 423 and the first and second drain regions 414 and 424 may be doped with n-type impurities.

The read transistor TR may further include a first spacer 415 on sidewalls of the first gate 411 and the first gate insulation layer 412. The anti-fuse AF may further include a second spacer 425 on sidewalls of the second gate 421 and the second gate insulation layer 422.

Figure 11:
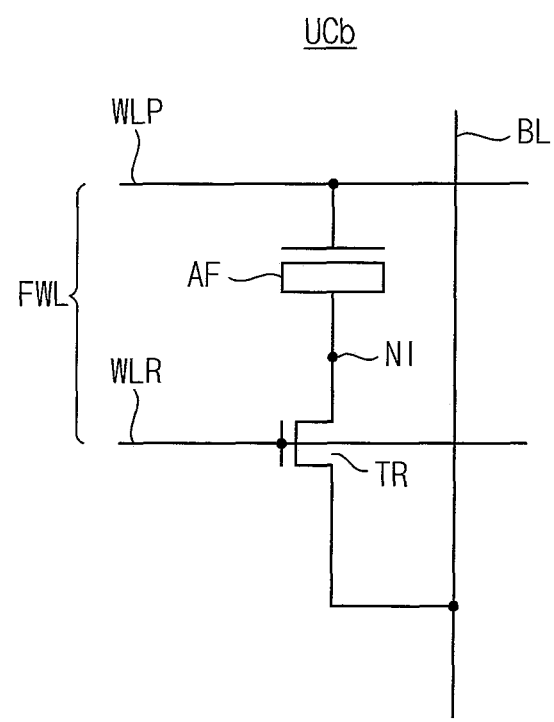
FIG. 11 illustrates an example of an OTP memory cell in the OTP memory device of FIG. 7.

FIG. 11 illustrates an example of an OTP memory cell in the OTP memory device of FIG. 7.

Referring to FIG. 11, an OTP memory cell UCb may include an anti-fuse AF and a read transistor TR. The anti-fuse AF may be connected between a corresponding voltage word-line WLP and an intermediate node NI. The read transistor TR may be connected between the intermediate node NI and a corresponding bit-line BL. A gate electrode of the read transistor TR may be connected to a corresponding read word-line WLR.

The anti-fuse AF may include, for example, a MOS capacitor. In an embodiment, as illustrated in FIG. 11, a first electrode of the MOS capacitor may be connected to the voltage word-line WLP and a second electrode of the MOS capacitor may be connected to the intermediate node NI.

The structure and the manufacturing process of the OTP memory cell UCb of FIG. 11 may be similar, for example, to the OTP memory cell UCa of FIG. 10. To implement the MOS capacitor, a conduction path may be added to electrically connect the second source region 423 and the second drain region 424 in FIG. 10.

Figure 12:
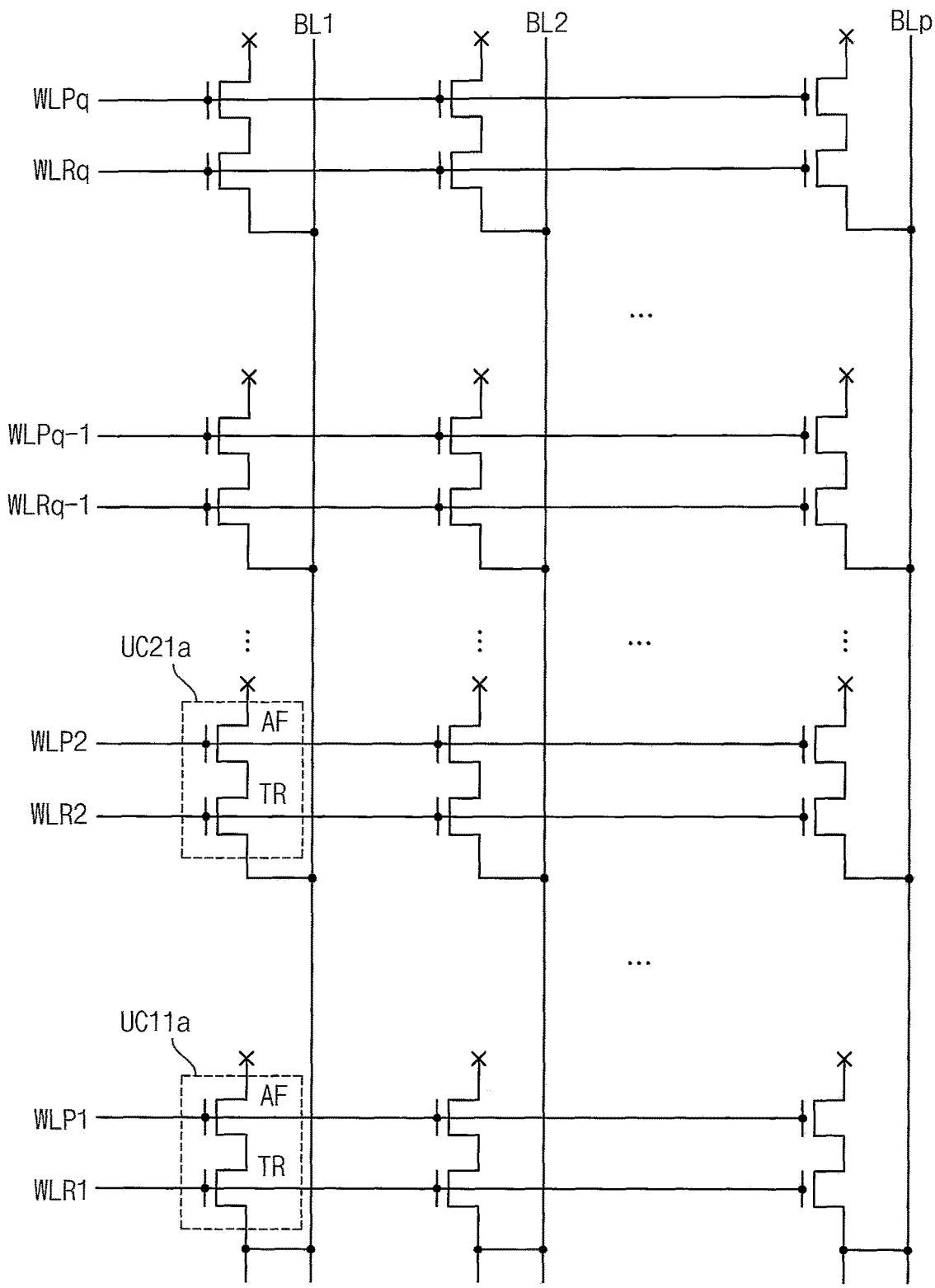
FIG. 12 is a circuit diagram illustrating an example of an OTP cell array included in the OTP memory device of FIG. 7.

FIG. 12 is a circuit diagram illustrating an example of an OTP cell array included in the OTP memory device of FIG. 7.

Referring to FIG. 12, an OTP cell array 410a may include a plurality of OTP memory cells UC11a and UC21a that are coupled to a plurality of bit-lines BL1 to BLp, a plurality of voltage word lines WLP1 to WLPq and a plurality of read word lines WLR1 to WLRq, respectively, and arranged in a q*p matrix. Here, q and p are positive integers.

The gate electrode of the read transistor TR may be connected to the corresponding read word-line WLRx (x=1 to q) and the source electrode of the read transistor TR may be connected to the corresponding bit-line BLy (y=1 to p).

The first electrode of the anti-fuse AF may be connected to the corresponding word-line WLPx and the second electrode of the anti-fuse AF may be connected to the drain electrode of the read transistor TR. Here, the first electrode of the anti-fuse AF may be a gate electrode, and the second electrode of the anti-fuse AF may be source electrode.

As described above, the anti-fuse AF may be a MOS transistor. The gate electrode or the first electrode of the MOS transistor AF may be connected to the corresponding voltage word-line WLPx, the source electrode or the second electrode of the MOS transistor AF may be connected to the drain electrode of the read transistor TR and the drain electrode of the MOS transistor AF may be floated.

Each of the OTP memory cells UC11a and UC21a may include the anti-fuse AF and the read transistor TR.

Figure 13:
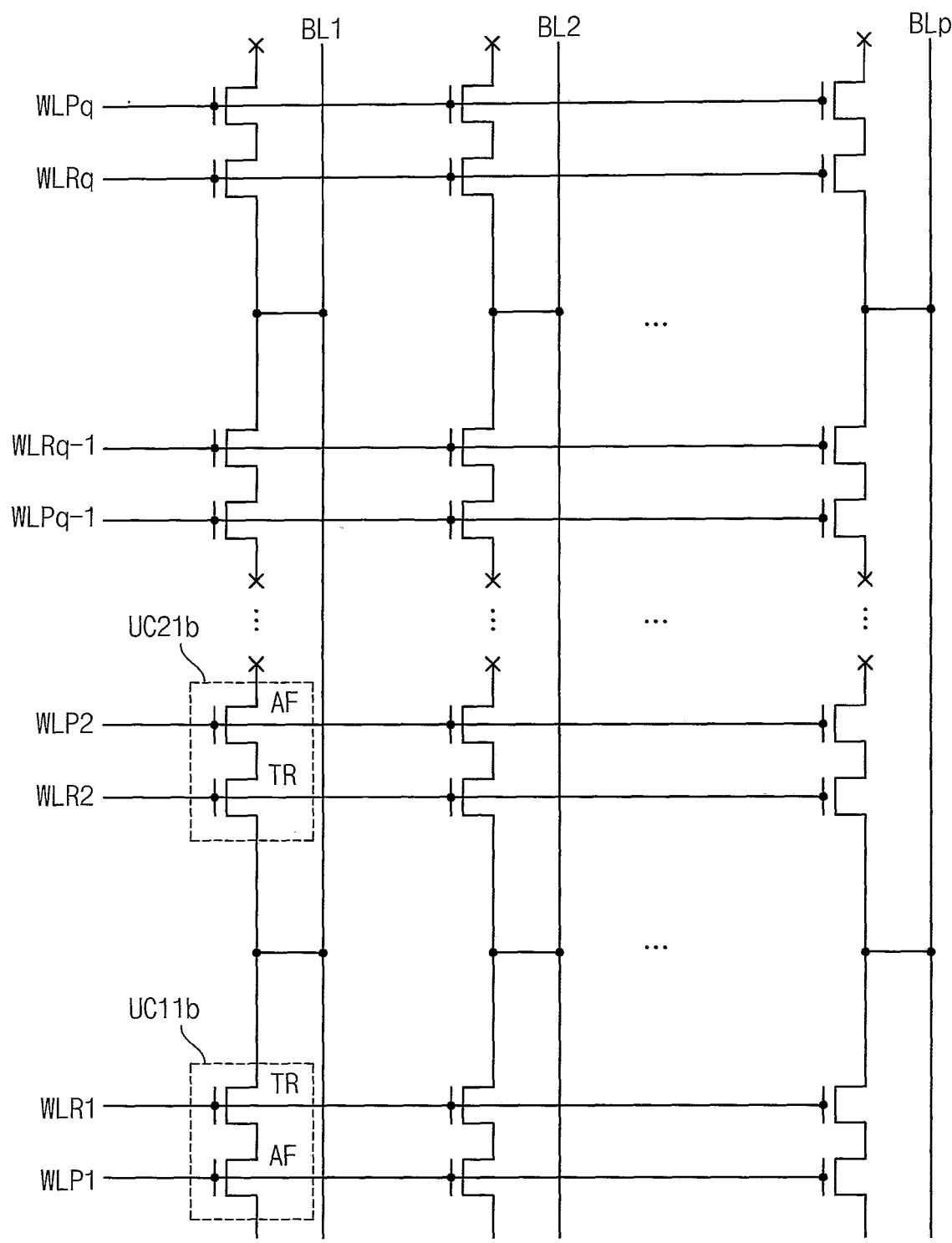
FIG. 13 is a circuit diagram illustrating an example of an OTP cell array included in the OTP memory device of FIG. 7.

FIG. 13 is a circuit diagram illustrating an example of an OTP cell array included in the OTP memory device of FIG. 7.

Referring to FIG. 13, an OTP cell array 410b may include a plurality of OTP memory cells UC11b and UC21b that are coupled to a plurality of bit-lines BL1 to BLp, a plurality of voltage word-lines WLP1 to WLPq and a plurality of read word-lines WLR1 to WLRq, respectively, and arranged in a q*p matrix.

The OTP cell array 410b of FIG. 13 differs from the OTP cell array 410a of FIG. 12 in that two OTP memory cells UC11b and UC21b constitute a pair. In other words, the read transistors TR in the adjacent two OTP memory cells are commonly coupled to a corresponding bit-line BL at a common node.

Figure 14:
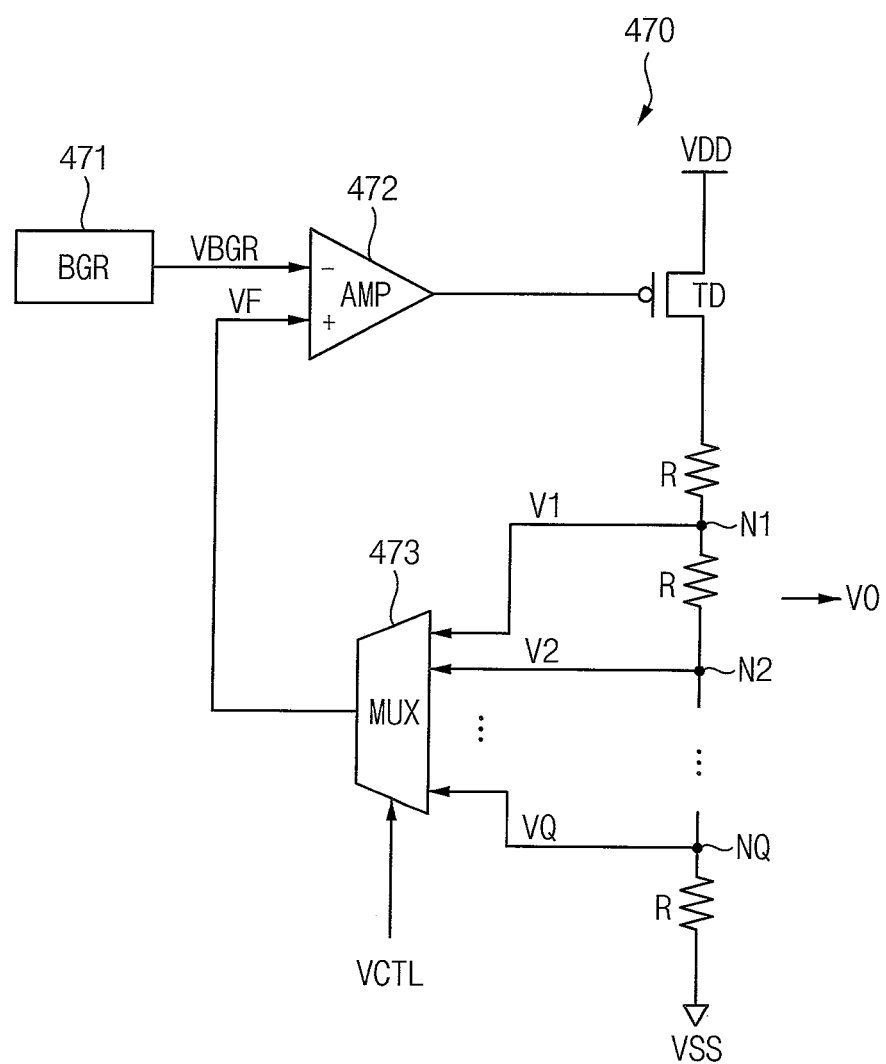
FIG. 14 is a block diagram illustrating an example of the voltage generator in the OTP memory device of FIG. 7 according to example embodiments.

FIG. 14 is a block diagram illustrating an example of the voltage generator in the OTP memory device of FIG. 7 according to example embodiments.

Referring to FIG. 14, the voltage generator 470 may include a band gap reference circuit (BGR) 471, an operational amplifier (AMP) 472, a driving transistor TD, division resistors R and a multiplexer (MUX) 473.

The operational amplifier 472 may amplify a difference between a band gap reference voltage VBGR and a feedback voltage VF to output an amplified voltage. The driving transistor TD is connected to a power supply voltage VDD to generate a driving current corresponding to the amplified voltage of the operational amplifier 472. The division resistors R are connected in series between the driving transistor TD and the ground voltage VSS to provide divided voltages V1 and V2 to VQ through division nodes N1 and N2 to NQ. Here, Q is a positive natural number greater than two. The multiplexer 473 may select one of the division voltages V1 and V2 to VQ based on the voltage control signal VCTL to provide the selected one of the division voltages V1 and V2 to VQ as the feedback voltage VF. An operating voltage VO may be provided at one of the division nodes N1 and N2 to NQ.

Figure 15:
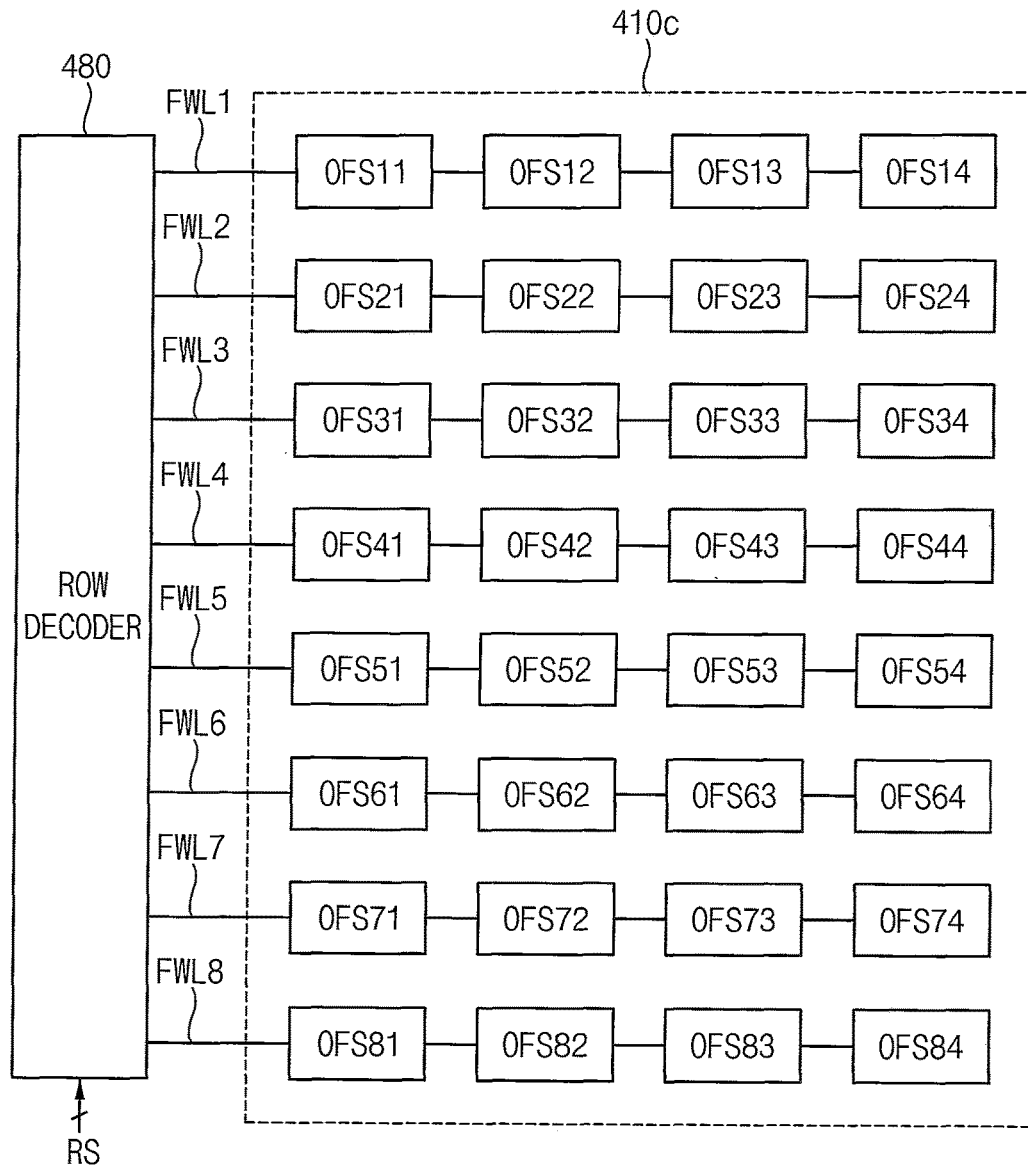
FIG. 15 is a block diagram illustrating an example of the OTP cell array in the OTP memory device of FIG. 7 according to example embodiments.

FIG. 15 is a block diagram illustrating an example of the OTP cell array in the OTP memory device of FIG. 7 according to example embodiments.

In FIG. 15, the row decoder 480 is illustrated together with an OTP cell array 410c. In addition, it is assumed that the OTP cell array 410c includes eight OTP cell rows and each of the OTP cell rows includes four OTP fuse sets.

Referring to FIG. 15, four OTP fuse sets OFS11, OFS12, OFS13 and OFS14 may be coupled to a word-line FWL1, four OTP fuse sets OFS21, OFS22, OFS23 and OFS24 may be coupled to a word-line FWL2, four OTP fuse sets OFS31, OFS32, OFS33 and OFS34 may be coupled to a word-line FWL3, four OTP fuse sets OFS41, OFS42, OFS43 and OFS44 may be coupled to a word-line FWL4, four OTP fuse sets OFS51, OFS52, OFS53 and OFS54 may be coupled to a word-line FWL5, four OTP fuse sets OFS61, OFS62, OFS63 and OFS64 may be coupled to a word-line FWL6, four OTP fuse sets OFS71, OFS72, OFS73 and OFS74 may be coupled to a word-line FWL7, and four OTP fuse sets OFS81, OFS82, OFS83 and OFS84 may be coupled to a word-line FWL8.

The row decoder 480 may select a OTP cell row coupled to one of word-lines FWL1 to FWL8 based on the row selection signal RS and one of the four OTP fuse sets in the selected OTP cell row may be selected based on the first column selection signal CS1. When it is assumed that the OTP cell row coupled to the word-line FWL1 is selected by the row selection signal RS, the OTP fuse set OFS11 may be selected by a first bit CS1[0] of the first column selection signal CS1, the OTP fuse set OFS12 may be selected by a second bit CS1[1] of the first column selection signal CS1, the OTP fuse set OFS13 may be selected by a third bit CS1[2] of the first column selection signal CS1 and the OTP fuse set OFS14 may be selected by a fourth bit CS1[3] of the first column selection signal CS1.

Figure 16:
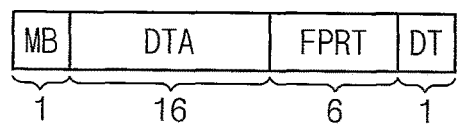
FIG. 16 illustrates one of the OTP fuse sets in FIG. 15 according to example embodiments.

FIG. 16 illustrates one of the OTP fuse sets in FIG. 15 according to example embodiments.

Referring to FIG. 16, an OTP fuse set OFSij (i corresponds to one of 1 to 8 and j corresponds to one of 1 to 4) may store the master bit MB, the fuse data DTA, the parity data FPRT and the dirty bit DT.

The master bit MB may include one bit and may indicate whether the fuse data DTA and the parity data FPRT are programmed in the OTP fuse set OFSij. The fuse data DTA may include 16-bits and may include a defective address. The parity data FPRT may include 6-bits, may correct signal bit error in the fuse data DTA and may detect double bit error in the fuse data DTA. The dirty bit DT may include one bit and may indicate whether the double bit error is detected in the fuse data DTA. When the double bit error is detected in the fuse data DTA, the control circuit 510 may invalidate the OTP fuse set OFSij by programming the dirty bit DT.

In general, when the data includes $2^t$-bits (t is a natural number greater than one) and the parity data include (t+1)-bits, a single bit error in the data may be corrected. In addition, the data includes $2^t$-bits and the parity data include (t+2)-bits, a single bit error in the data may be corrected and double bit error may be detected.

Figure 17A:
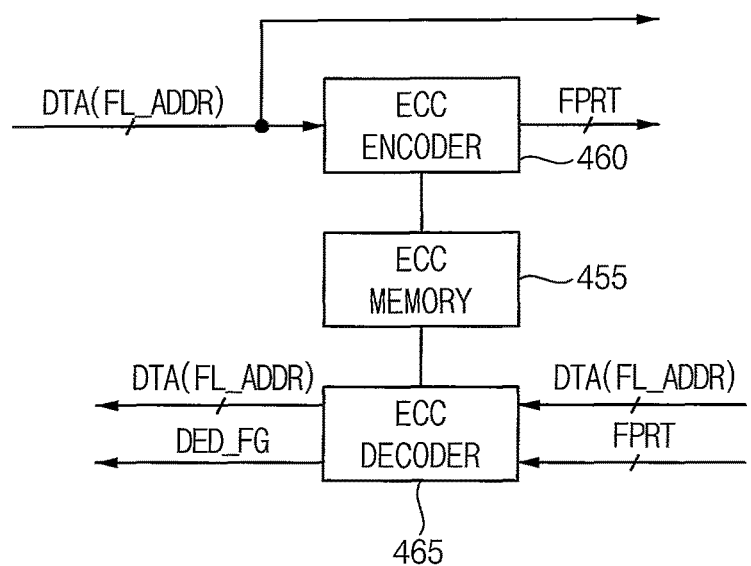
FIG. 17A is a block diagram illustrating an example of the ECC engine in the OTP memory device of FIG. 7 according to example embodiments.

FIG. 17A is a block diagram illustrating an example of the ECC engine in the OTP memory device of FIG. 7 according to example embodiments.

Referring to FIG. 17A, the ECC engine 450 may include an ECC memory 455, an ECC encoder 460 and an ECC decoder 465.

The ECC memory 455 may store an ECC that is capable of correcting a single bit error and capable of detecting double bit error.

The ECC encoder 460, in a write operation, may generate the parity data FPRT by performing an ECC encoding (operation) on the fuse data DTA including the defective address FL_ADDR.

The ECC decoder 465, in a read operation, may receive the fuse data DTA including the defective address FL_ADDR the parity data FPRT and may perform an ECC decoding (operation) on the fuse data DTA including the defective address FL_ADDR the parity data FPRT. Based on a result of the ECC decoding, the ECC decoder 465 may output the fuse data DTA in response to no error being detected in the fuse data DTA or the parity data FPRT, may output the fuse data DTA by correcting the single bit error in response to the single bit error being detected in the fuse data DTA or the parity data FPRT, or may output the fuse data DTA while activating the double error detection flag DED_FG without correcting the double bit error in response to the double bit error being detected in the fuse data DTA, the parity data FPRT, or the fuse data DTA and the parity data FPRT. That is, the double bit error may be detected in the fuse data DTA, the parity data FPRT or the fuse data DTA and the parity data FPRT.

Figure 17B:
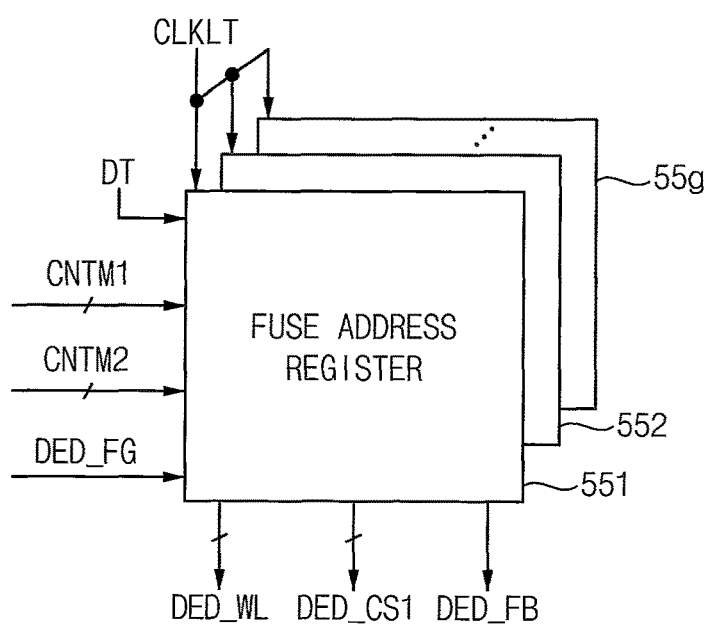
FIG. 17B illustrates an example of the double error fuse address register set in the OTP memory device of FIG. 7 according to example embodiments.

FIG. 17B illustrates an example of the double error fuse address register set in the OTP memory device of FIG. 7 according to example embodiments.

Referring to FIG. 17B, the double error fuse address register set 550 may include a plurality of fuse address registers 551, 552, . . . , 55g (g is a natural number greater than two).

Each of the plurality of fuse address registers 551, 552, . . . , 55g, during or when the double error detection flag DED_FG is activated, may store the first selected clock signal CNTM1 and the second selected clock signal CNTM2 of the OTP fuse set of which the dirty bit DT has a logic low level as a defective row address DED_WL and a defective column address DED DS1 of a defective OTP fuse set in which the double bit error is detected, respectively, in response to a rising transition of the latch clock signal CLKLT, and may store the double error detection flag DED_FG as the double error flag bit DED_FB.

Figure 18:
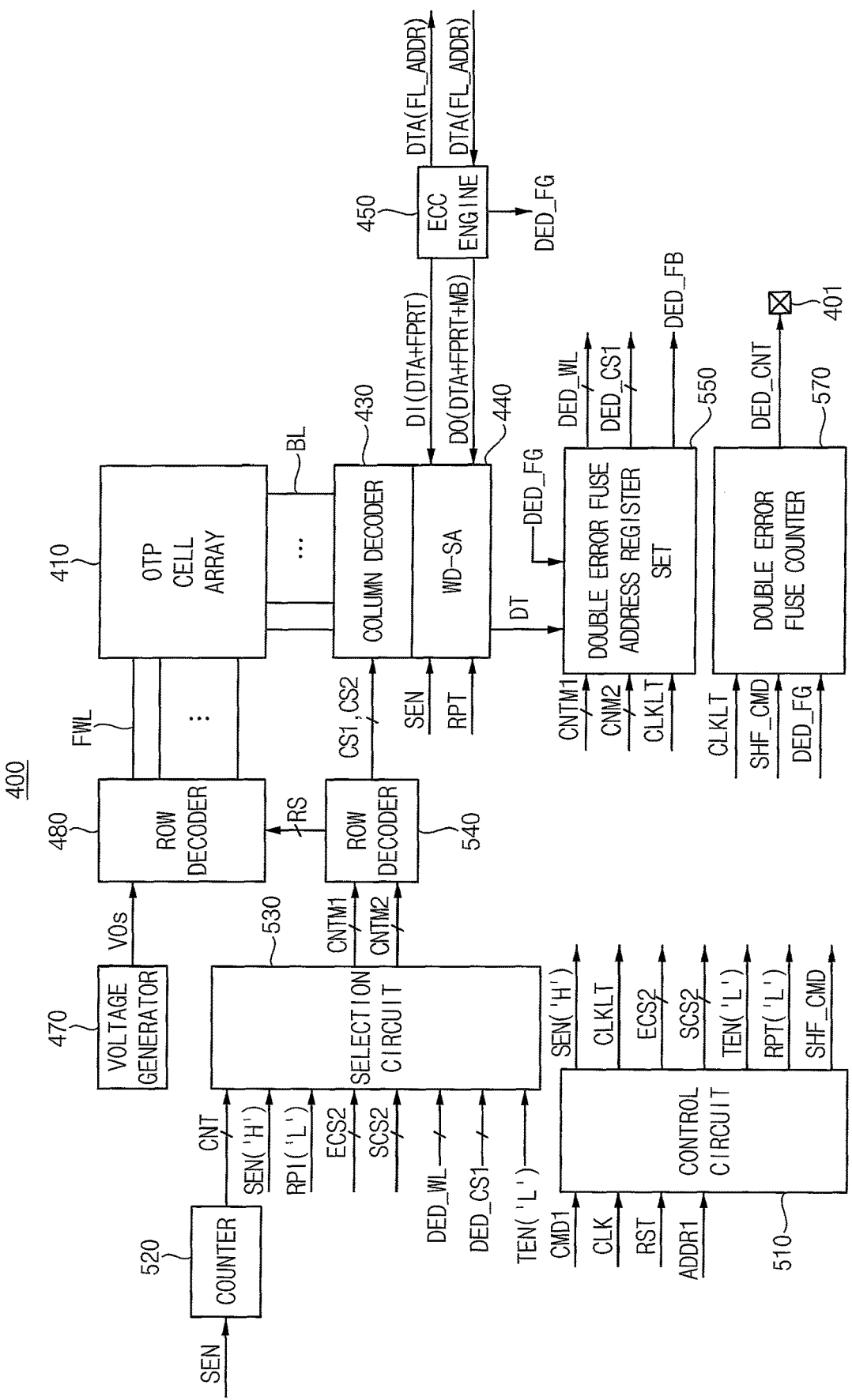
FIG. 18 illustrates the OTP memory device of FIG. 7 in a read operation.
Figure 19:
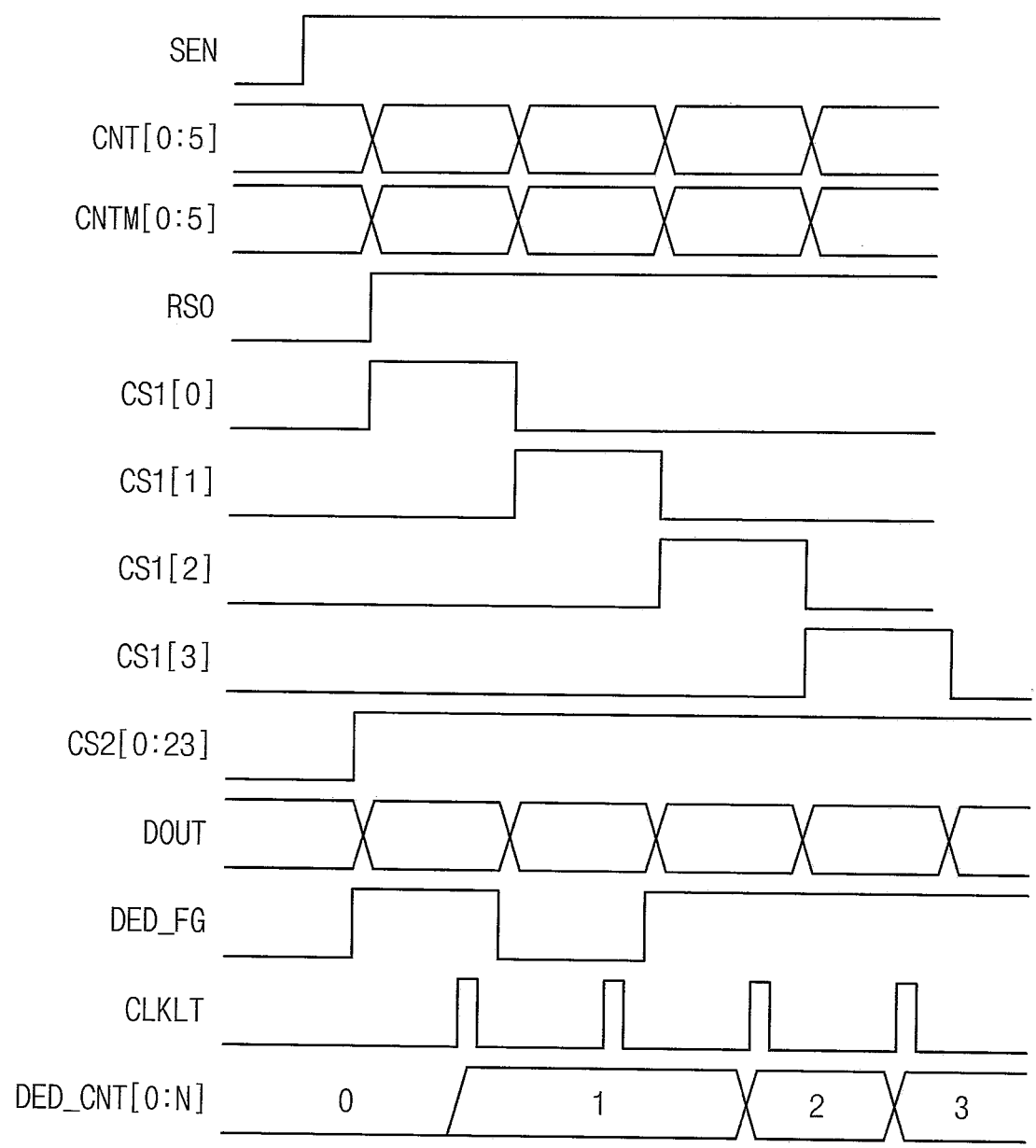
FIGS. 19, 20 and 21 are timing diagrams illustrating an operation of the OTP memory device of FIG. 18, respectively.
Figure 20:
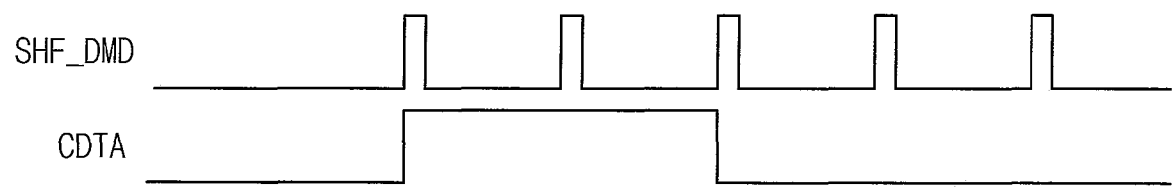
Figure 21:
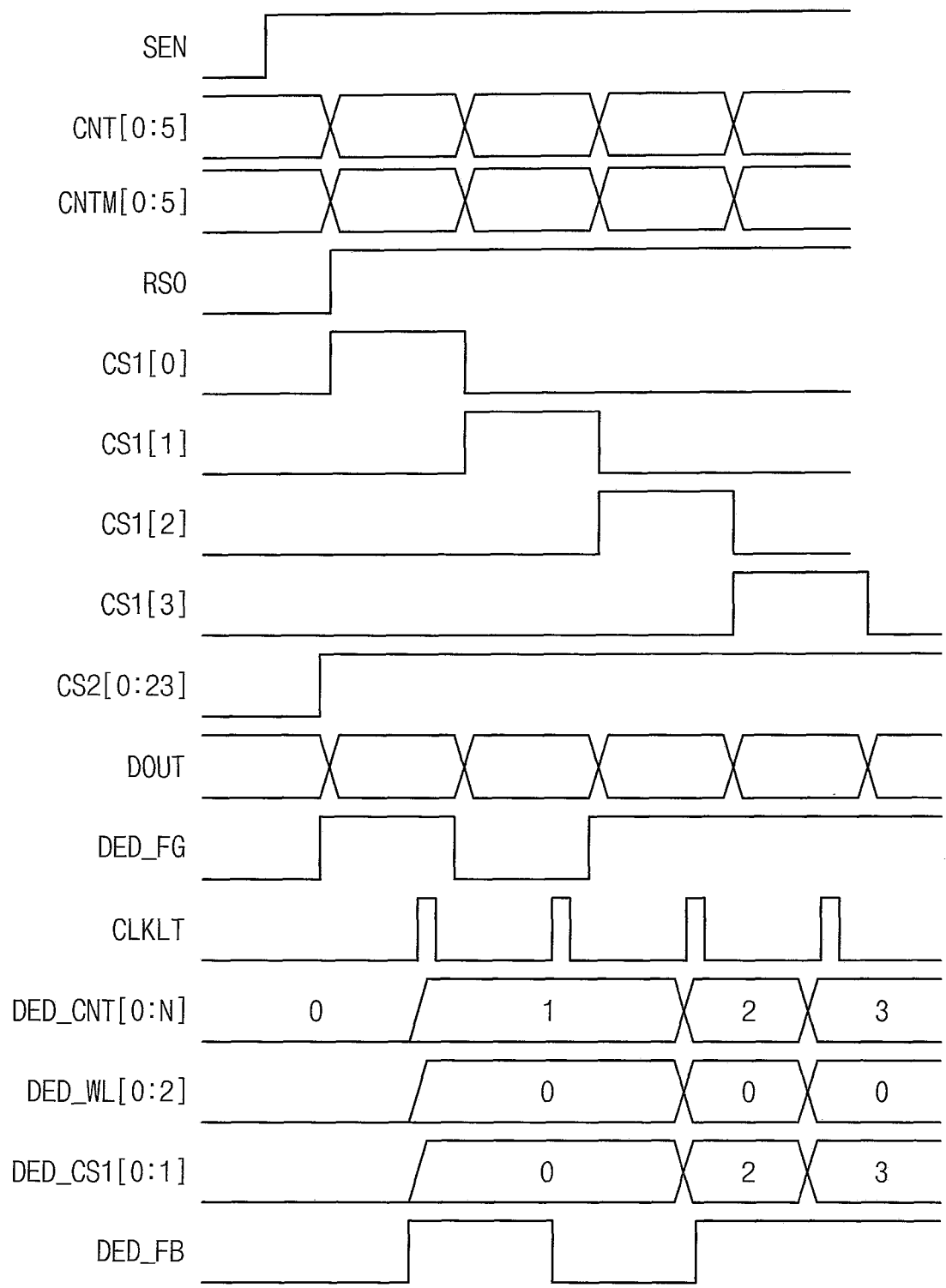

FIG. 18 illustrates the OTP memory device of FIG. 7 in a read operation and FIGS. 19, 20 and 21 are timing diagrams illustrating an operation of the OTP memory device of FIG. 18, respectively.

In FIGS. 18, 19, 20 and 21, the OTP cell array 410 in the OTP memory device 400 of FIG. 7 employs the OTP cell array 410c of FIG. 16 and the word-line FWL is selected.

FIG. 19 is a timing diagram illustrating a case of counting the OTP fuse sets in which the double bit error is detected in a read operation.

Referring to FIGS. 18 and 19, in a read operation, the sensing signal SEN is activated with a logic high level (denoted by 'H') and each of the rupture signal RPT and the test signal TEN is deactivated with a logic low level (denoted by 'L').

The counter 520 provides the selection circuit 530 with the count signal CNT[0:5] that increments sequentially during or when the sensing signal SEN is activated, and the selection circuit 530 provides the pre-decoder 540 with a selected count signal CNTM[0:5] based on the count signal CNT[0:5] and in response to the sensing signal SEN that is activated.

The pre-decoder 540, based on the selected count signal CNTM[0:5], may activate a row selection signal RS0 for selecting the word-line FWL1, may sequentially activate bits CS1[0], CS1[1], CS1[2] and CS1[3] of the first column selection signal CS1, which, respectively, select the OTP fuse sets OFS11, OFS12, OFS13 and OFS14 that are coupled to the word-line FWL1, and may activate the second column selection signal CS2 for selecting OTP memory cells in respective one of the OTP fuse sets OFS11, OF S12, OF and OF during or when the row selection signal RS0 is activated.

The write-sensing circuit 440 sequentially reads the master bit MB, the fuse data DTA, the parity data FPRT and the dirty bit DT stored in respective one of the OTP fuse sets OFS11, OF S12, OF S13 and OF S14 through the column decoder 430, provides the master bit MB, the fuse data DTA and the parity data FPRT to the ECC engine 450 and provides the dirty bit DT to the double error fuse address register set 550.

The ECC engine 450 (the ECC decoder 465 in FIG. 17A) performs the ECC decoding on the fuse data DTA and the parity data FPRT in respective one of the OTP fuse sets OFS11, OFS12, OFS13 and OFS14 based on the master bit MB in respective one of the OTP fuse sets OF S11, OF S12, OF and OF S14 that are sequentially provided from the write-sensing circuit 440. Based on a result of the ECC decoding, because the double bit error is detected in the fuse data DTA stored in each of the OTP fuse sets OF OF and OF the ECC decoder 465 activates the double error detection flag DED_FG in an operation interval of each of the OTP fuse sets OFS11, OFS13 and OFS14 and provides the double error detection flag DED_FG to the double error fuse address register set 550 and the double error fuse counter 570.

The double error fuse address register set 550, during or when the double error detection flag DED_FG is activated, stores the first selected clock signal CNTM1 and the second selected clock signal CNTM2 as the defective row address DED_WL and the defective column address DED_CS1 of each of the defective OTP fuse sets OFS11, OFS13 and OFS14, in response to a rising transition of the latch clock signal CLKLT, and stores the double error detection flag DED_FG with a logic high level.

The double error fuse counter 570 stores the double error counted value DED_CNT in the register 571 (see FIG. 7) by counting the double error detection flag DED_FG having a logic high level, in response to a rising transition of the latch clock signal CLKLT. Because the double bit error is detected in each of three OTP fuse sets OFS11, OFS13 and OFS14, the double error counted value DED_CNT corresponding to three may be stored in the register 571.

FIG. 20 illustrates that the double error fuse counter 570 outputs the double error counted value DED_CNT to an outside of (e.g., to a device that is external to) the OTP memory device 400.

Referring to FIGS. 18 and 20, the double error fuse counter 570 outputs the double error counted value DED_CNT stored in the register 571 as the count data CDTA to an outside (i.e., the test device 60 in FIG. 2) through the I/O pin 401 in response to the shift command SHF_CMD from the control circuit 510. Therefore, the test device 60 in FIG. 2 may determine that the double bit error is detected in three of the OTP fuse sets OF S11, OF S12, OF S13 and OFS14 based on the count data CDTA.

FIG. 21 illustrates that the double error fuse address register set 550 stores addresses of the OTP fuse sets in which the double bit error is detected and the double error flag bit.

Referring to FIGS. 18, 19 and 21, because the double bit error is detected in each of three OTP fuse sets OFS11, OFS13 and OFS14, the double error fuse address register set 550, during or when the double error detection flag DED_FG is activated, stores the first selected clock signal CNTM1 and the second selected clock signal CNTM2 as the defective row address DED_WL and the defective column address DED_CS1 of each of the defective OTP fuse sets OFS11, OFS13 and OFS14, in response to a rising transition of the latch clock signal CLKLT, and stores the double error flag bit DED_FB with a logic high level.

Figure 22:
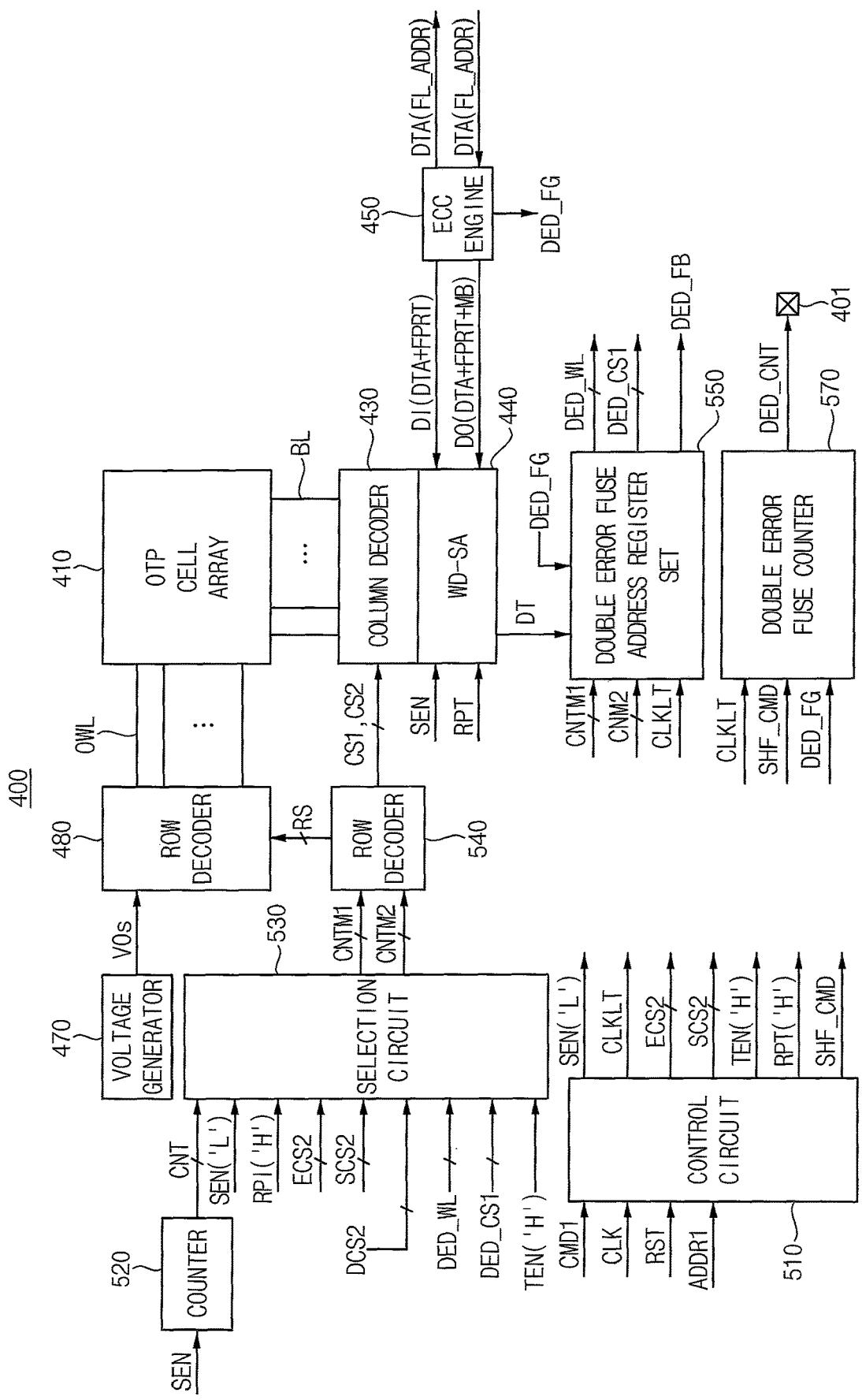
FIG. 22 illustrates the OTP memory device of FIG. 7 in an invalidation operation.
Figure 23:
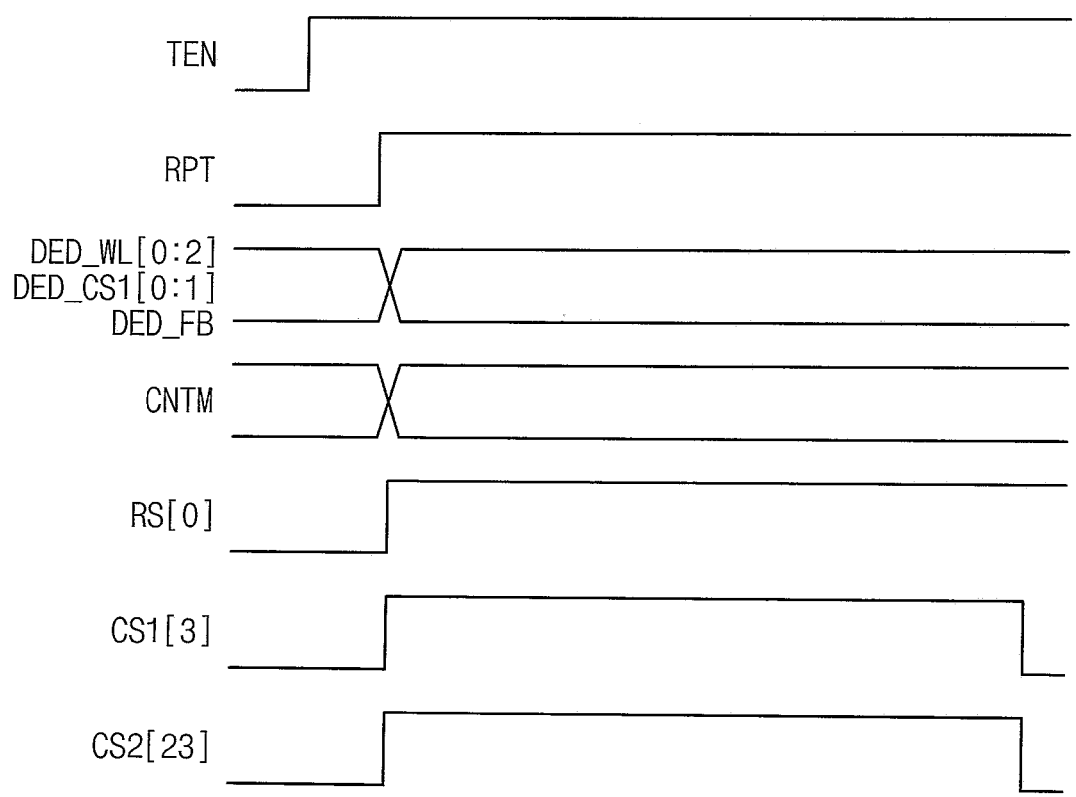
FIG. 23 is a timing diagram illustrating an operation of the OTP memory device of FIG. 22.

FIG. 22 illustrates the OTP memory device of FIG. 7 in an invalidation operation and FIG. 23 is a timing diagram illustrating an operation of the OTP memory device of FIG. 22.

In FIGS. 22 and 23, the OTP cell array 410 in the OTP memory device 400 of FIG. 7 employs the OTP cell array 410c of FIG. 16 and the control circuit 510 invalidates the OTP fuse set OFS14 coupled to the word-line FWL1.

Referring to FIGS. 22 and 23, when an invalidation command is input to the OTP memory device 400, the control circuit 510 activates rupture signal RPT and the test signal TEN with a logic high level (denoted by 'H') and deactivates the sensing signal SEN with a logic low level (denoted by 'L'). The selection circuit 530 provides the pre-decoder 540 with a selected count signal CNTM[0:5] based on the defective row address DED_WL, the defective column address DED_CS1 and the double error flag bit DED_FB which are provided from the double error fuse address register set 550. The defective row address DED_WL and the defective column address DED_CS1 may designate the OTP fuse set OFS14 coupled to the word-line FWL1 and the double error flag bit DED_FB may designate an OTP memory cell storing the dirty bit DT of the OTP fuse set OFS14.

The pre-decoder 540, based on the selected count signal CNTM[0:5], may activate a row selection signal RS0 for selecting the word-line FWL1, may activate the bit CS1[3] of the first column selection signal CS1, which selects the OTP fuse set and OF coupled to the word-line FWL1, and may activate the second column selection signal CS2[23] for selecting OTP memory cell storing the dirty bit DT of the OTP fuse set OF during or when the row selection signal RS is activated.

The write-sensing circuit 440 may invalidate the fuse data and the parity data stored in the OTP fuse set OFS14 by rupturing the OTP memory cell storing the dirty bit DT to program the dirty bit DT to a logic high level.

Figure 24:
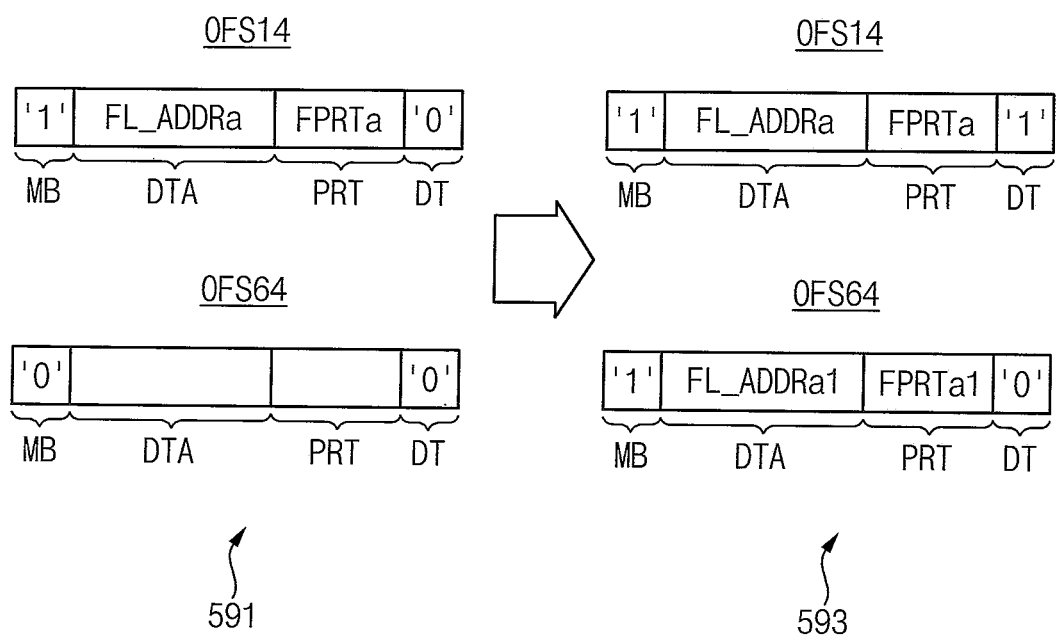
FIG. 24 illustrates that the OTP memory device of FIG. 7 stores the fuse data in another OTP fuse set while invalidating an OTP fuse set in which the double bit error is detected.

FIG. 24 illustrates that the OTP memory device of FIG. 7 stores the fuse data in another OTP fuse set while invalidating an OTP fuse set in which the double bit error is detected.

In FIG. 24, the OTP cell array 410 in the OTP memory device 400 of FIG. 7 employs the OTP cell array 410*c* of FIG. 16 and the control circuit 510 invalidates the OTP fuse set OF S14 coupled to the word-line FWL1.

Referring to FIG. 24, as a reference numeral 591 indicates, before an ECC decoding operation is performed on the OTP fuse set OFS14, the fuse data DTA in the OTP fuse set OFS14 includes a defective address FL_ADDRa, the parity data FPRT in the OTP fuse set OFS14 includes parity data FPRTa and the dirty bit DT the OTP fuse set OFS14 has a logic low level ('0'). In addition, the master bit MB in an OTP fuse set OF S64 that does not store a defective address has a logic low level ('0') and the dirty bit DT in the OTP fuse set OF S64 has a logic low level ('0').

As a reference numeral 593 indicates, because the double bit error is detected in the fuse data DTA in the OTP fuse set OFS14 after an ECC decoding operation is performed on the OTP fuse set OFS14, the control circuit 510 invalidates the fuse data DTA in the OTP fuse set OFS14 by programming the dirty bit DT the OTP fuse set OFS14 with a logic high level ('1'). In addition, the control circuit 510 programs a defective address FL_ADDRa1 corresponding to the defective address FL_ADDRa and a parity data FPRTa1 in the OTP fuse set OFS64 and programs the master bit MB in the OTP fuse set OFS64 with a logic high level ('a'). The control circuit 510 may receive the defective address FL_ADDRa1 from the test device 60 in FIG. 2 and may receive the parity data FPRTa1 from the ECC engine 450 in FIG. 7.

Figure 25:
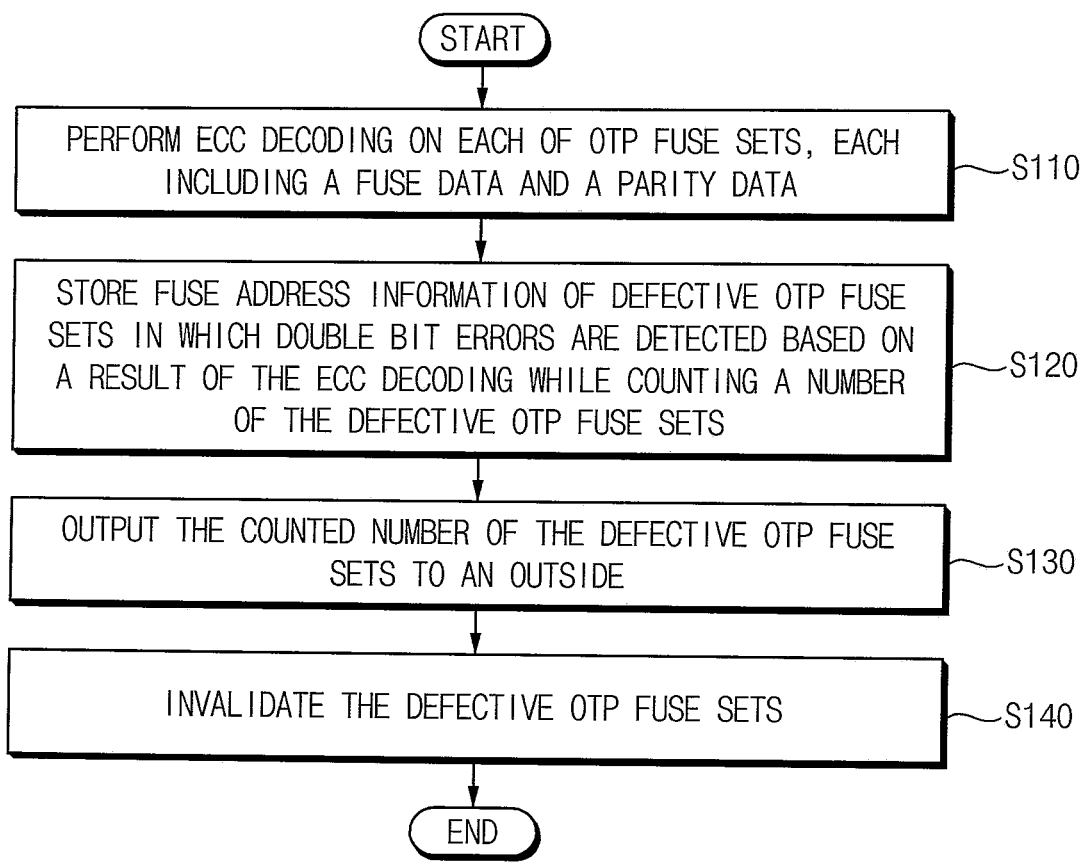
FIG. 25 is a flow chart illustrating an operation of an OTP memory device according to example embodiments.

FIG. 25 is a flow chart illustrating an operation of an OTP memory device according to example embodiments.

Referring to FIGS. 7 through 25, there is provided a method of an OTP memory device 400. The OTP memory device 400 includes an OTP cell array including a plurality of OTP cell rows, each of the plurality of OTP cell rows includes a plurality of OTP fuse sets, and each of the OTP fuse sets includes a plurality of OTP memory cells. According to the method, an ECC engine 450 sequentially performs an ECC decoding operation on first OTP fuse sets from among the plurality of OTP fuse sets, and each of the first OTP fuse sets stores a fuse data and a parity data (operation S110). A control circuit 510 based on a result of the ECC decoding, stores fuse address information of OTP fuse sets in each of which a double bit error is detected, in double error fuse address register set 550 while a double error fuse counter 570 counts a number of defective OTP fuse sets in each of which a double bit error is detected (operation S120).

The double error fuse counter 570 outputs a double error counting signal DED_CNT to an outside of (e.g., to a device that is external to) the OTP memory device 400 in response to a shift command SHF_CMD (operation S130).

A write-sensing circuit 440 invalidates the fuse data stored in each of the defective OTP fuse sets by programming a dirty bit in each of the defective OTP fuse sets (operation S140).

Therefore, the OTP memory device and a semiconductor memory device including the OTP memory device according to example embodiments, may output a number of defective OTP fuse sets in each of which a double bit error is detected to an outside of or device external to the OTP memory device, may invalidate the fuse data stored in each of the defective OTP fuse sets by programming a dirty bit in each of the defective OTP fuse sets, and may program the fuse data stored in each of the defective OTP fuse sets in free OTP fuse sets. Accordingly, the OTP memory device and the semiconductor memory device may provide enhanced reliability and usability.

Figure 26:
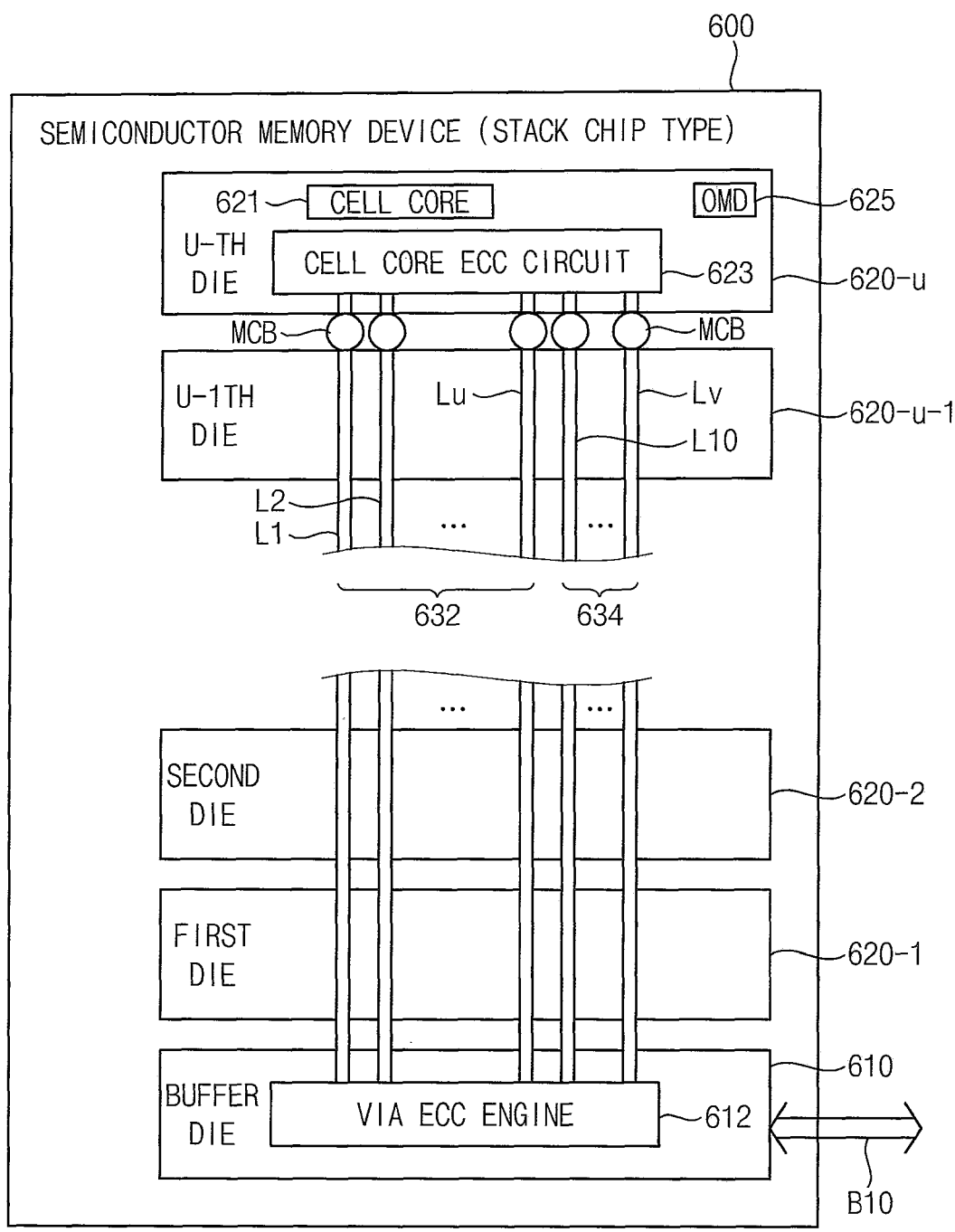
FIG. 26 is a block diagram illustrating a semiconductor memory device according to example embodiments.

FIG. 26 is a block diagram illustrating a semiconductor memory device according to example embodiments.

Referring to FIG. 26, a semiconductor memory device 600 may include a buffer die 610 and a plurality of memory dies 620-1 to 620-*u* providing a soft error analyzing and correcting function in a stacked chip structure. Here, u is a natural number greater than three.

The plurality of memory dies 620-1 to 620-*u* are stacked on the buffer die 610 and conveys data through a plurality of through substrate via (e.g., through silicon via (TSV)) lines for At least one of the memory dies 620-1 to 620-*u* may include a cell core 621 including a memory cell array, a cell core ECC engine 622 which generates transmission parity data based on transmission data to be sent to the buffer die 611 and an OTP memory device OMD 625. The OTP memory device 625 may employ the OTP memory device of FIG. 7.

Therefore, the OTP memory device 625 may output a number of defective OTP fuse sets in each of which a double bit error is detected to an external device that is outside of the OTP memory device, may invalidate the fuse data stored in each of the defective OTP fuse sets by programming a dirty bit in each of the defective OTP fuse sets, and may program the fuse data stored in each of the defective OTP fuse sets in free OTP fuse sets. Accordingly, the OTP memory device 625 may provide enhanced reliability and usability.

The buffer die 610 may include a via ECC engine 612 which corrects a transmission error using the transmission parity data when a transmission error is detected from the transmission data received through the TSV liens and generates error-corrected data.

The semiconductor memory device 600 may be a stack chip type memory device or a stacked memory device which conveys data and control signals through the TSV lines. The TSV lines may be also called 'through electrodes'.

A data TSV line group 632 which is formed at least one of the memory dies 620-1 to 620-*u* may include TSV lines L1 and L2 to L*u*, and a parity TSV line group 634 may include TSV lines L10 to L*v*. The TSV lines L1 and L2 to L*u* of the data TSV line group 632 and the parity TSV lines L10 to L*v* of the parity TSV line group 634 may be connected to micro bumps MCB which are correspondingly formed among the memory dies 620-1 to 620-*u*.

At least one of the memory dies 620-1 to 620-*u* may include DRAM cells each including at least one access transistor and one storage capacitor.

The semiconductor memory device 600 may have a three-dimensional (3D) chip structure or a 2.5D chip structure to communicate with the host through a data bus B10.

The buffer die 610 may be connected to an external memory controller through the data bus B10.

The via ECC engine 612 may determine whether a transmission error occurs at the transmission data received through the data TSV line group 632, based on the transmission parity data received through the parity TSV line group 634. When a transmission error is detected, the via ECC engine 612 may correct the transmission error on the transmission data using the transmission parity data. When the transmission error is uncorrectable, the via ECC engine 612 may output information indicating occurrence of an uncorrectable data error.

Figure 27:
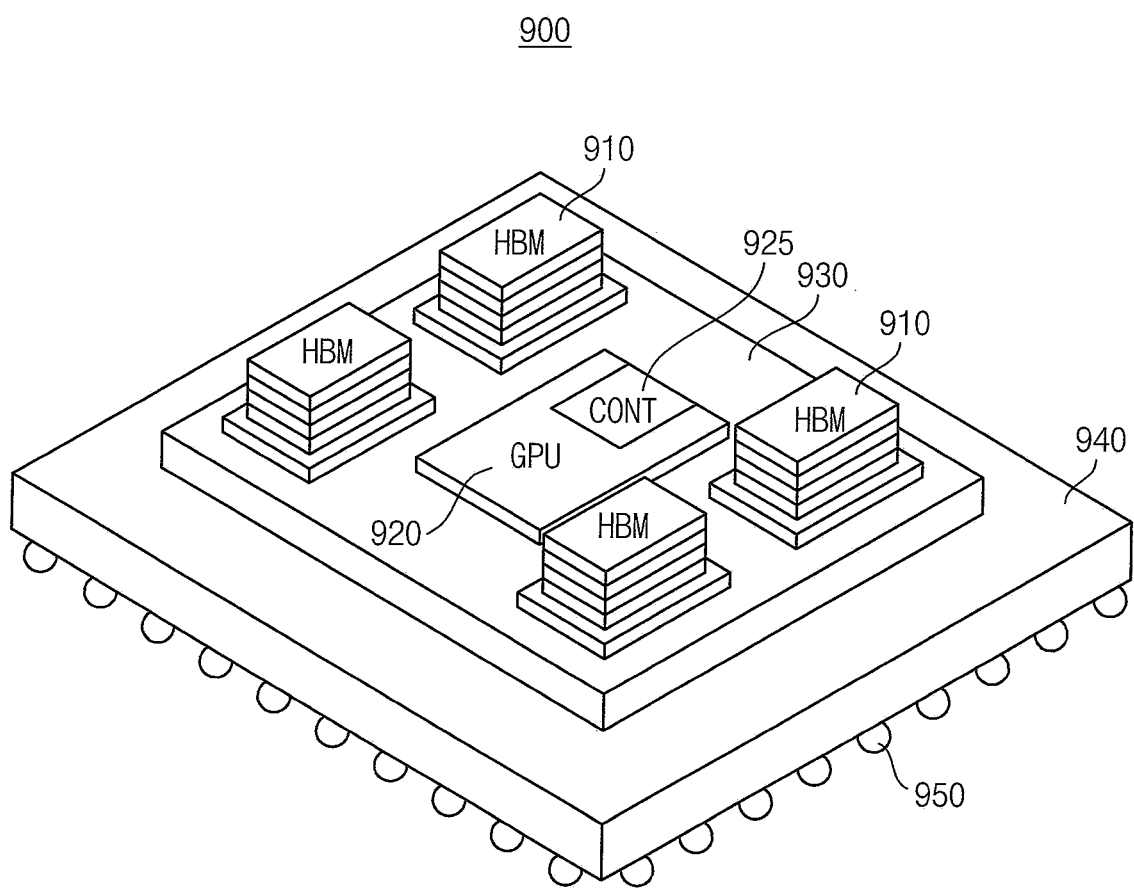
FIG. 27 is a diagram illustrating a semiconductor package including the stacked memory device, according to example embodiments.

FIG. 27 is a diagram illustrating a semiconductor package including the stacked memory device, according to example embodiments.

Referring to FIG. 27, a semiconductor package 900 may include one or more stacked memory devices 910 and a graphic processing unit (GPU) 920. The GPU 920 may include a memory controller CONT 925.

The stacked memory devices 910 and the GPU 920 may be mounted on an interposer 930, and the interposer on which the stacked memory devices 910 and the GPU 920 are mounted may be mounted on a package substrate 940. The package substrate 940 may be mounted on solder balls 950. The memory controller 925 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies. Each of the memory dies may include a memory cell array, a cell core ECC engine and an OTP memory device as described previously.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

Aspects of the present disclosure may be applied to systems using semiconductor memory devices that employ a plurality of volatile memory cells and an OTP memory device. For example, aspects of the present disclosure may be applied to systems such as a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the teachings and advantages of the present disclosure. Accordingly, all such modifications are intended to be included within the scope of the present disclosure as defined in the appended claims.

What is claimed is:

1. A one-time programmable (OTP) memory device, comprising:
    an OTP cell array comprising a plurality of OTP cell rows, each of the plurality of OTP cell rows comprising a plurality of OTP fuse sets, each of the OTP fuse sets comprising a plurality of OTP memory cells;
    an error correction code (ECC) decoder configured to:
        perform an ECC decoding operation on first OTP fuse sets from among the plurality of OTP fuse sets, each of the first OTP fuse sets configured to store fuse data and parity data;
        based on the ECC decoding operation, correct a single bit error in response to detection of the single bit error in a first subset from among the first OTP fuse sets; and
        activate a double error detection flag in response to detection of a double bit error in a second subset from among the first OTP fuse sets;
    a double error fuse address register set configured to store fuse address information of the second subset and the double error detection flag based on a latch clock signal;
    a double error fuse counter configured to store a double error counting signal by counting the double error detection flag based on the latch clock signal; and
    a control circuit configured to generate the latch clock signal and configured to control the ECC decoder, the double error fuse address register set, and the double error fuse counter.

2. The OTP memory device of claim 1, wherein each of the plurality of OTP fuse sets is configured to further store a master bit indicating whether the fuse data and the parity data are stored in each of the plurality of OTP fuse sets, and
    wherein the ECC decoder is configured to sequentially perform the ECC decoding operation on the first OTP fuse sets storing the master bit having a first logic level, from among the plurality of OTP fuse sets.

3. The OTP memory device of claim 1, wherein the double error fuse counter is configured to output the double error counting signal as counted data to a device that is external to the OTP memory device in response to a shift command from the control circuit.

4. The OTP memory device of claim 1, further comprising:
    a row decoder coupled to the OTP cell array through a plurality of read word-lines and a plurality of voltage word-lines;
    a column decoder coupled to the OTP cell array through a plurality of bit-lines;
    a write-sensing circuit coupled to the column decoder;
    a counter configured to generate a count signal that is incremented sequentially in response to an activation of a sensing signal;
    a selection circuit configured to generate a first selected count signal and a second selected count signal based on the sensing signal and a rupture signal from the control circuit, the first selected count signal being associated with a row address of each of the plurality of OTP fuse sets, the second selected count signal being associated with a column address of each of the plurality of OTP fuse sets; and
    a pre-decoder configured to generate a row selection signal, a first column selection signal, and a second column selection signal based on the first selected count signal and the second selected count signal, and configured to provide the row selection signal to the row decoder and provide the first column selection signal and the second column selection signal to the column decoder, the row selection signal being for selecting one of the plurality of OTP cell rows, the first column selection signal being for selecting one of the plurality of OTP fuse sets as a selected OTP fuse set, the second column selection signal being for selecting one OTP memory cell from among the selected OTP fuse set, wherein the control circuit is further configured to control the write-sensing circuit and the selection circuit.

5. The OTP memory device of claim 4, wherein each of the plurality of OTP fuse sets is configured to further store a dirty bit indicating whether the double bit error is detected therein, and wherein the double error fuse address register set is configured to store the first selected count signal and the second selected count signal as the fuse address information of the second subset, based on the dirty bit and in response to activation of the double error detection flag.

6. The OTP memory device of claim 5, wherein the double error fuse address register set is configured to:

provide the selection circuit with the fuse address information of the second subset as a defective row address and a defective column address of each of the second subset; and provide the selection circuit with the double error detection flag as a double error flag bit.

7. The OTP memory device of claim 6, wherein the control circuit, in response to the rupture signal that is activated and an activated test signal from the control circuit, is configured to:

provide the pre-decoder with the defective row address as the first selected count signal; and provide the pre-decoder with the defective column address as the second selected count signal.

8. The OTP memory device of claim 7, wherein the pre-decoder is configured to:

generate the row selection signal that selects a OTP cell row including the second subset from among the plurality of OTP cell rows, based on the first count selection signal; and generate the first column selection signal that selects one of the second subset in the OTP cell row that was selected and generate the second column selection signal that selects an OTP memory cell storing the dirty bit of the selected OTP fuse set, based on the second count selection signal.

9. The OTP memory device of claim 8, wherein the write-sensing circuit is configured to rupture an anti-fuse of the OTP memory cell storing the dirty bit of the selected OTP fuse set, in response to activation of the rupture signal.

10. The OTP memory device of claim 4, wherein each of the plurality of OTP fuse sets is configured to further store a master bit indicating whether the fuse data and the parity data are stored in each of the plurality of OTP fuse sets, and wherein the control circuit, based on the master bit, is configured to store the fuse data stored in each of the second subset in free OTP fuse sets which do not store the fuse data and the parity data, from among the plurality of OTP fuse sets, by controlling the write-sensing circuit and the selection circuit.

11. The OTP memory device of claim 4, wherein the selection circuit comprises:

a first multiplexer configured to output the first selected count signal by selecting one of a first count signal corresponding to a first portion of bits of the count signal and a defective row address of each of the second subset, based on the sensing signal and the rupture signal;

a second multiplexer configured to output the second selected count signal by selecting one of a second count signal corresponding to a second portion of bits of the count signal and a defective column address of each of the second subset, based on the sensing signal and the rupture signal;

a third multiplexer configured to select one of a default column selection signal or an external column selection signal provided from the control circuit based on a test signal from the control circuit, the default column selection signal including a double error flag bit that is based on the double error detection flag; and a fourth multiplexer configured to select one of a sensing column selection signal or an output of the third multiplexer based on the sensing signal and the rupture signal, the sensing column selection signal being provided from the control circuit.

12. The OTP memory device of claim 11, wherein the pre-decoder comprises:

a first pre-decoder configured to generate the row selection signal by decoding the first selected count signal;

a second pre-decoder configured to generate the first column selection signal by decoding the second selected count signal; and a third pre-decoder configured to generate the second column selection signal by decoding an output of the fourth multiplexer.

13. The OTP memory device of claim 11, wherein, in response to activation of the sensing signal, the first multiplexer is configured to output the first count signal as the first selected count signal, the second multiplexer is configured to output the second count signal as the second selected count signal, and the fourth multiplexer is configured to select the sensing column selection signal.

14. The OTP memory device of claim 11, wherein in response to activation of the rupture signal, the first multiplexer is configured to output the defective row address as the first selected count signal, the second multiplexer is configured to output the defective column address as the second selected count signal, and the fourth multiplexer is configured to select the output of the third multiplexer.

15. The OTP memory device of claim 11, wherein the third multiplexer is configured to:

output the default column selection signal in response to activation of the test signal; and output the external column selection signal in response to deactivation of the test signal.

16. A semiconductor memory device comprising:

a memory cell array comprising a plurality of memory cell rows, each of the plurality of memory cell rows comprising a plurality of memory cells;

a one-time programmable (OTP) memory device configured to store at least one defective address of at least one defective memory cell row including an uncorrectable error that is determined based on testing the plurality of memory cell rows;

an address comparator configured to output a matching signal by comparing an access address and the at least one defective address, the access address designating a target memory cell row from among the plurality of memory cell rows; and a repair address generator configured to provide a first row decoder coupled to the memory cell array with a repair address that replaces the at least one defective address, in response to the matching signal indicating that the access address matches the at least one defective address, and wherein the OTP memory device comprises:
- an OTP cell array comprising a plurality of OTP cell rows, each of the plurality of OTP cell rows comprising a plurality of OTP fuse sets, each of the OTP fuse sets comprising a plurality of OTP memory cells;
- an error correction code (ECC) decoder configured to:
  - perform an ECC decoding operation on first OTP fuse sets from among the plurality of OTP fuse sets, each of the first OTP fuse sets configured to store fuse data and parity data;
  - based on the ECC decoding operation, correct a single bit error in response to detection of the single bit error in a first subset from among the first OTP fuse sets; and
  - activate a double error detection flag in response to detection of a double bit error in a second subset from among the first OTP fuse sets;
- a double error fuse address register set configured to store fuse address information of the second subset and the double error detection flag based on a latch clock signal;
- a double error fuse counter configured to store a double error counting signal by counting the double error detection flag based on the latch clock signal; and
- a control circuit configured to generate the latch clock signal and configured to control the ECC decoder, the double error fuse address register set, and the double error fuse counter.

17. The semiconductor memory device of claim 16, wherein the first row decoder is configured to enable a redundancy word-line of a redundancy memory region in the memory cell array, in response to the repair address.

18. The semiconductor memory device of claim 16, wherein the double error fuse counter is configured to output the double error counting signal as a counted data to a device that is external to the OTP memory device in response to a shift command from the control circuit.

19. The semiconductor memory device of claim 16, wherein the OTP memory device further comprises:
- a row decoder coupled to the OTP cell array through a plurality of read word-lines and a plurality of voltage word-lines;
- a column decoder coupled to the OTP cell array through a plurality of bit-lines;
- a write-sensing circuit coupled to the column decoder;
- a counter configured to generate a count signal that is incremented sequentially in response to an activation of a sensing signal;
- a selection circuit configured to generate a first selected count signal and a second selected count signal based on the sensing signal and a rupture signal from the control circuit, the first selected count signal being associated with a row address of each of the plurality of OTP fuse sets, the second selected count signal being associated with a column address of each of the plurality of OTP fuse sets; and
- a pre-decoder configured to generate a row selection signal, a first column selection signal, and a second column selection signal based on the first selected count signal and the second selected count signal, and configured to provide the row selection signal to the row decoder and provide the first column selection signal and the second column selection signal to the column decoder, the row selection signal being for selecting one of the plurality of OTP cell rows, the first column selection signal being for selecting one of the plurality of OTP fuse sets as a selected OTP fuse set, the second column selection signal being for selecting one OTP memory cell from among the selected OTP fuse set, wherein the control circuit is further configured to control the write-sensing circuit and the selection circuit.

20. A one-time programmable (OTP) memory device, comprising:
- an OTP cell array comprising a plurality of OTP cell rows, each of the plurality of OTP cell rows comprising a plurality of OTP fuse sets, each of the OTP fuse sets comprising a plurality of OTP memory cells;
- a row decoder coupled to the OTP cell array through a plurality of read word-lines and a plurality of voltage word-lines;
- a column decoder coupled to the OTP cell array through a plurality of bit-lines;
- a write-sensing circuit coupled to the column decoder;
- an error correction code (ECC) decoder configured to:
  - perform an ECC decoding operation on first OTP fuse sets from among the plurality of OTP fuse sets, each of the first OTP fuse sets configured to store fuse data and parity data;
  - based on the ECC decoding operation, correct a single bit error in response to detection of the single bit error in a first subset of the first OTP fuse sets; and
  - activate a double error detection flag in response to detection of a double bit error in a second subset of the first OTP fuse sets;
- a double error fuse address register set configured to store fuse address information of the second subset of the first OTP fuse sets and the double error detection flag based on a latch clock signal;
- a double error fuse counter configured to store a double error counting signal in the double error fuse counter by counting the double error detection flag based on the latch clock signal;
- a counter configured to generate a count signal that is incremented sequentially in response an activation of a sensing signal;
- a selection circuit configured to generate a first selected count signal and a second selected count signal based on the sensing signal and a rupture signal, the first selected count signal being associated with a row address of each of the plurality of OTP fuse sets, the second selected count signal being associated with a column address of each of the plurality of OTP fuse sets;
- a pre-decoder configured to generate a row selection signal, a first column selection signal, and a second column selection signal based on the first selected count signal and the second selected count signal, and configured to provide the row selection signal to the row decoder and provide the first column selection signal and the second column selection signal to the column decoder, the row selection signal being for selecting one of the plurality of OTP cell rows, the first column selection signal being for selecting one of the plurality of OTP fuse sets as a selected OTP fuse set, the second column selection signal being for selecting one OTP memory cell from among the selected OTP fuse set; and
- a control circuit configured to generate the latch clock signal and the rupture signal and configured to control the ECC decoder, the double error fuse address register set, the double error fuse counter, and the selection circuit.

\* \* \* \* \*